(12) United States Patent
Tsutsui et al.

(10) Patent No.: US 6,623,269 B2
(45) Date of Patent: Sep. 23, 2003

(54) THERMAL TREATMENT APPARATUS

(75) Inventors: Yuji Tsutsui, Hirakata (JP); Hiroyuki Naka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/048,227

(22) PCT Filed: May 25, 2001

(86) PCT No.: PCT/JP01/04392

§ 371 (c)(1),
(2), (4) Date: Jan. 29, 2002

(87) PCT Pub. No.: WO01/92800

PCT Pub. Date: Dec. 6, 2001

(65) Prior Publication Data

US 2003/0118966 A1 Jun. 26, 2003

(30) Foreign Application Priority Data

May 30, 2000 (JP) ......................................... 2000-160095

(51) Int. Cl.⁷ .................................................. F27B 9/02
(52) U.S. Cl. ........................ 432/128; 432/143; 432/163; 266/176
(58) Field of Search ........................ 432/64, 121, 128, 432/129, 143, 148, 163, 171, 207, 217; 266/176

(56) References Cited

U.S. PATENT DOCUMENTS

| | | | | |
|---|---|---|---|---|
| 1,485,118 A | * | 2/1924 | Larrson | 432/128 |
| 3,807,943 A | | 4/1974 | McKinstry | |
| 4,397,451 A | * | 8/1983 | Kinoshita et al. | 432/128 |
| 4,767,324 A | * | 8/1988 | Hitch | 432/171 |
| 5,052,923 A | * | 10/1991 | Peter et al. | 432/128 |
| 6,217,317 B1 | * | 4/2001 | Crafton et al. | 432/128 |

FOREIGN PATENT DOCUMENTS

| | | |
|---|---|---|
| JP | 5-295449 | 11/1993 |
| JP | 7-3274 | 1/1995 |
| JP | 11-142061 | 5/1999 |

* cited by examiner

Primary Examiner—Gregory Wilson
(74) Attorney, Agent, or Firm—Wenderoth, Lind & Ponack, L.L.P.

(57) ABSTRACT

A thermal treatment apparatus has a plurality of thermal treatment chambers in which an object to be treated is thermally treated while being transported, and at least one pair of two adjacent thermal treatment chambers of which inside temperatures are different from each other. The thermal treatment chambers are connected through a thermal insulating structural member, whereby thermal conduction between the chambers, such as muffles, is prevented to reduce a heat loss caused in the thermal treatment apparatus. Therefore, input thermal energy which is necessary to carry out a predetermined thermal treatment is significantly reduced without affecting quality and yield of the object.

20 Claims, 14 Drawing Sheets

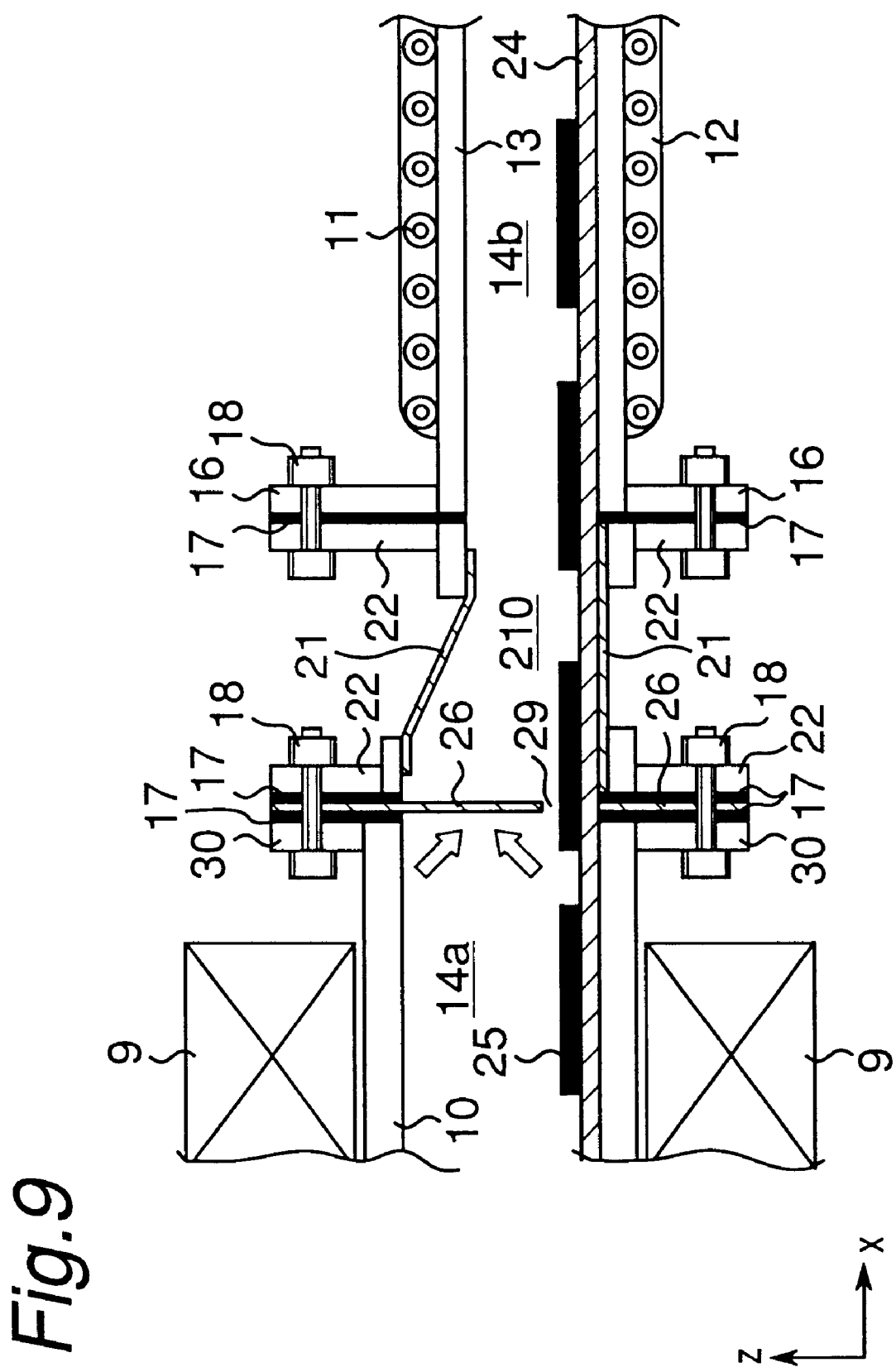

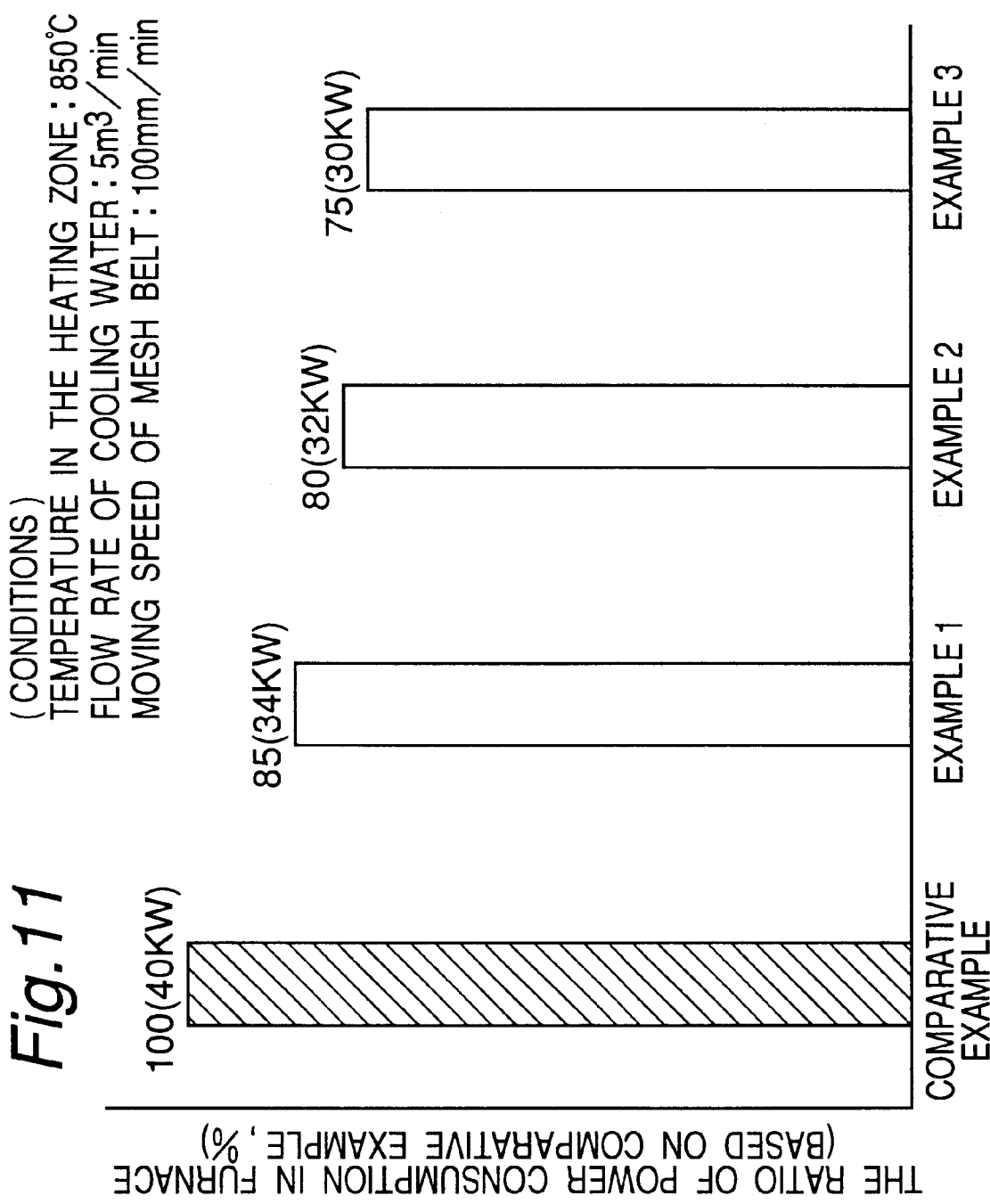

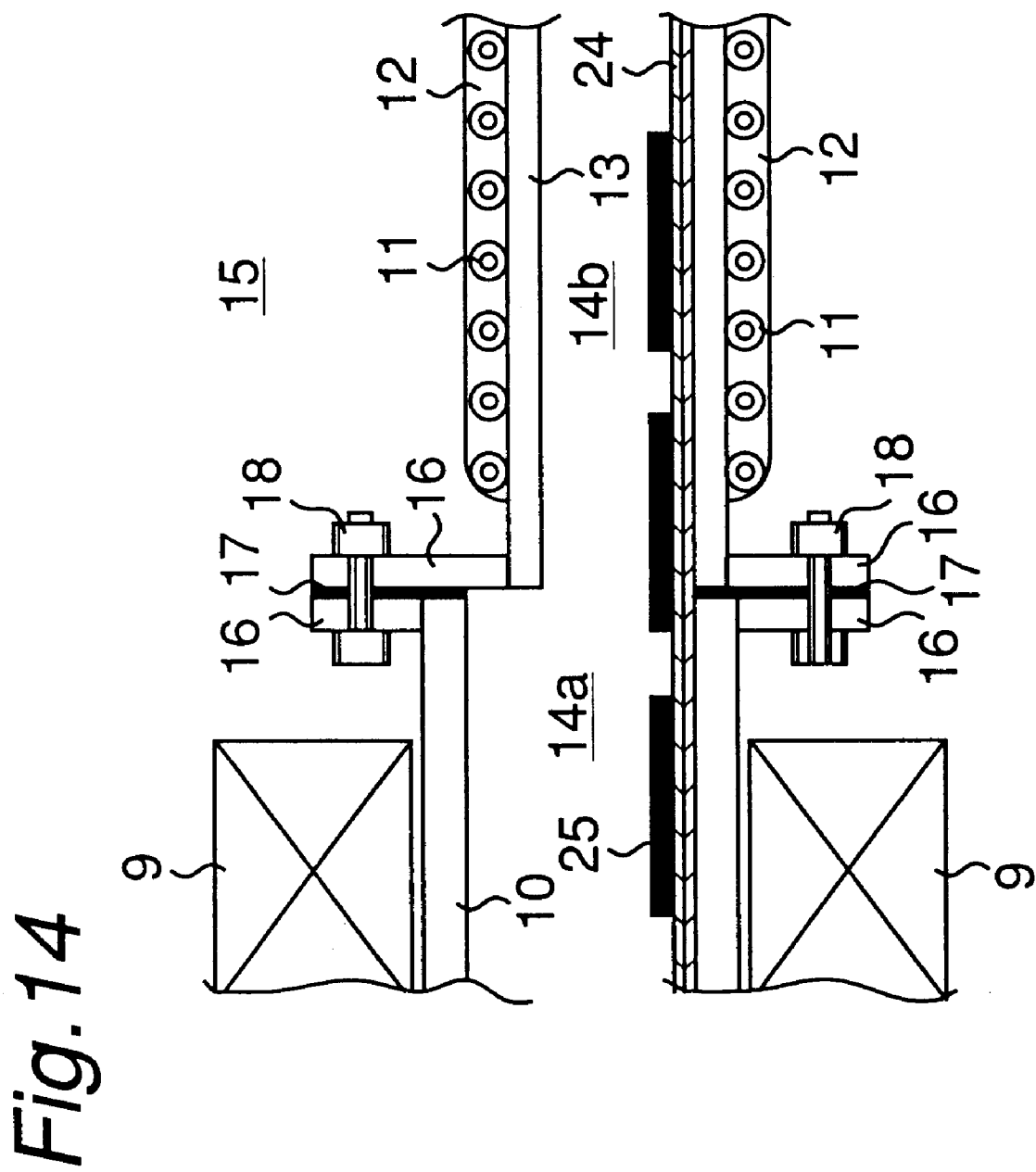

THERMAL TREATMENT APPARATUS

TECHNICAL FIELD

The present invention relates to a thermal treatment apparatus used for a thermal treatment of a starting material, an intermediate product or a final product.

BACKGROUND ART

Various thermal treatment processes such as a heating process and a cooling process are employed in the processes of manufacturing various products such as a plasma display panel, a solar battery panel, a resistor chip and other devices and electronic parts. Numerous effects achieved by a thermal treatment are known. Specifically, drying, dehydration, calcination, reaction acceleration, surface modification, sealing, degassing, annealing and so on are known.

In a case where a heating furnace is used as a thermal treatment apparatus, the thermal treatment apparatus generally has a plurality of thermal treatment chambers arranged in the direction of transporting an object to be treated. Each thermal treatment chamber has a space provided therein in which the object is subjected to a thermal treatment, namely a thermal treatment zone. A heating furnace generally has a temperature raising zone (temperature raising chamber) in which the object is heated to rise in temperature, a thermostatic zone (thermostatic chamber) in which the object is maintained at the raised temperature, and a temperature lowering zone (temperature lowering chamber) in which the object is cooled down to decrease in temperature, as the thermal treatment zones. The object to be treated is subjected to predetermined thermal treatment processes while passing through each zone in the order described above. Typically, heat is applied in the temperature raising zone, while such an amount of heat is supplied which compensates for heat dissipation in the thermostatic zone, and heat is removed in the temperature lowering zone.

Therefore, the temperature raising zone and the thermostatic zone in which heat is applied to the object to be treated may also be called a heating zone. And the temperature lowering zone in which heat is removed from the object may also be called a cooling zone. The temperature lowering zone may also be called a slow cooling zone or a quenching zone depending on the decrease in temperature of the object which decrease is effected during the period from the entry of the object into the zone to the exit of the object from the zone (temperature decreasing rate). The slow cooling zone is generally a zone in which the temperature of the object entering the zone is lowered at a rate, for example, from several degrees to several tens of degrees Celsius per minute. The quenching zone is generally a zone in which the temperature of the object entering the zone is lowered at a rate of several hundreds of degrees Celsius per minute or higher.

Dimensions of the heating zone and the cooling zone are determined according to thermal treatment conditions on the basis of a throughput of the object to be treated, such as the time required for heating, cooling rate and a temperature of the object at the exit and the floor space required to install the thermal treatment apparatus.

In the case of a thermal treatment apparatus having a plurality of thermal treatment chambers, it is necessary to maintain the temperature in the thermal treatment chamber (namely the temperature in the thermal treatment zone) at a predetermined level so as to ensure that the predetermined thermal treatment effect is achieved in each of the thermal treatment chambers. For this purpose, temperature in the thermal treatment chamber is controlled by means of proper heating or cooling means and a temperature monitor.

The thermal treatment apparatus having a plurality of thermal treatment chambers may be a thermal treatment apparatus wherein an object to be treated is transported intermittently through the thermal treatment zones of the thermal treatment chambers, or a thermal treatment apparatus wherein an object to be treated is transported continuously through the thermal treatment zones of the thermal treatment chambers. An example of the thermal treatment apparatus wherein the object is transported intermittently is disclosed, for example, in Japanese Kokai Patent Publication No. 11-142061.

In the thermal treatment apparatus described in this publication, thermal separation between the thermal treatment zones is ensured by shielding each thermal treatment zone from other thermal treatment zones so that the thermal treatment zone will not be thermally influenced by the adjacent thermal treatment zones. Specifically, this thermal treatment apparatus has a shutter apparatus comprising a plate-like shutter disposed between heating zones and a pair of thermal insulating walls disposed to sandwich the shutter. The shutter is positioned at a shielding position where the heating zones are shielded from each other or at a retracted position where interference with the object being transported is prevented. That is, the shutter is placed at the retracted position when the object is moved between heating zones, and is placed at the shielding position when the object is moved into the heating zone. The object introduced into the heating zone is caused to stand still in the heating zone or to move back and forth therein so as to be subjected to a thermal treatment into a predetermined temperature.

In this thermal treatment apparatus, the shutter shields the heating zones from each other, while a thermal insulation effect is provided by the thermal insulating walls disposed at the border between the heating zones and an air layer formed between the thermal insulating walls. Thereby, each heating zone is thermally influenced as little as possible by the other adjacent heating zones. The air layer formed between the thermal insulating walls also prevents heat from being directly transmitted from the high temperature heating zone to the low temperature heating zone. Accordingly, in accordance with this thermal treatment apparatus, a temperature in each heating zone can be quickly controlled to the predetermined level after transporting the object intermittently and closing the shutter. In other words, this thermal treatment apparatus ensures independence of each thermal treatment zone by means of the movable shutter and the thermal insulating walls. This provides such advantages as the quality of the object can be assured and the total length of the thermal treatment apparatus can be made smaller.

Now the thermal treatment apparatus wherein the object to be treated is transported continuously is described below.

As an example of thermal treatment apparatus having a plurality of thermal treatment chambers wherein the object is transported continuously, there is one that applies a thermal treatment indirectly to the object while transporting the object in the thermal treatment chamber, called a muffle, which has a tunnel structure and is heated or cooled by proper heating or cooling means. The object is transported by conveyance means such as a mesh belt conveyor or a roller hearth. This type of thermal treatment apparatus is often called a muffle furnace or a muffle structure heating furnace. In the muffle furnace, the thermal treatment zone is defined by the muffle wall, and the thermal treatment zone is a thermal treatment atmosphere that is maintained at a predetermined temperature by heating means or the like installed outside the muffle.

The "thermal treatment atmosphere" refers to a space in which an object to be treated is placed. Heat is applied to or removed from the object placed in this space by means of a gas contained in the space, a heating device, cooling device and/or the wall that defines the space. The "thermal treatment atmosphere" is also referred to merely as an "atmosphere". The gas included in the thermal treatment atmosphere is called an "atmosphere gas".

In the muffle furnace, the object is carried into the thermal treatment atmosphere and is desirably heat-treated by being heated or cooled indirectly via the inside surface of the muffle wall. Since the muffle furnace does not have heating means or the like in the thermal treatment zone, uneven heating in the thermal treatment zone and variations in the heating control due to the heater configuration can be mitigated. That is, since the thermal treatment zone has a more uniform thermal treatment atmosphere in the muffle furnace, it possible to apply a stable thermal treatment to the object to be treated with a desired temperature profile.

The muffle is typically a cylindrical structure made of a metal. The muffle is constructed, for example, in an integral cylindrical structure. Alternatively, the muffle may also be made in a square tube by forming the wall from thermal insulating blocks.

An example of the basic constitution of the muffle furnace is shown in FIG. 13. The muffle furnace (100) has a heating zone (heating chamber) in which the object to be treated is heated to rise in temperature and a cooling zone (cooling chamber) in which the object to be treated is cooled down to decrease in temperature arranged in the direction of transporting the object. The object undergoes predetermined thermal treatment processes while passing through the zones successively.

The muffle furnace shown in FIG. 13 is described below in more detail. A heating muffle (2) that forms the heating zone is made of a metal with the external wall thereof being surrounded by electric heater modules (1). The heating muffle (2) is heated by the electric heater modules (1) and is maintained at a predetermined temperature according to the desired thermal treatment. A cooling muffle (8) that forms the cooling zone is also made of a metallic material. A cooling water pipe (7) is provided on the external wall surface of the cooling muffle (8), so that the inside of the cooling muffle (8) is maintained at a predetermined temperature by the cooling water flowing in the cooling water pipe (7). The entire muffle including the heater modules (1) is surrounded by a wall (or an external panel) (110).

In the heating muffle (2), a mesh belt (3) that is a carrier moves continuously in one direction. An object (4) to be heat-treated is placed on the mesh belt (3) and moves from a loading section (5) to an unloading section (6). In the embodiment shown in the drawing, the mesh belt is disposed in parallel to the floor surface whereon the apparatus is installed (the X-Y plane in FIG. 13) and moves in the X direction.

As an alternative to the mesh belt, there is a carrier formed by arranging a multitude of cylindrical rollers with the longitudinal direction thereof disposed at right angles to the transporting direction and in parallel to the floor surface whereon the apparatus is installed (the X-Y plane in FIG. 13), namely in the Y direction in FIG. 13. Such a carrier is generally called a "roller hearth". When the roller hearth is employed, the object to be treated is transported by the rotation of the rollers.

The object to be treated (4) is heated while passing through the inside of the heating muffle (2) that is maintained at the predetermined temperature. After passing through the heating muffle (2), the mesh belt (3) and the object (4) pass through the inside of the cooling muffle (8). When passing through the cooling muffle (8), the object (4) is cooled down indirectly by the cooling water that passes through the cooling water pipe (7).

Now a section where two muffles are connected, namely the section around a joint of muffles is described below. FIG. 14 is a sectional view schematically showing the joint between the heating muffle (10) and the cooling muffle (13). The heater (9) is disposed around the heating muffle (10), and the cooling water pipe (11) is bonded onto the surface of the cooling muffle (13) by means of a heat resistant cement (12) or the like. The heating muffle (10) and the cooling muffle (13) are mechanically connected to each other by means of bolts/nuts (18) at joint members (a pair of flanges in the embodiment shown in the drawing) (16). A sealing member (17) made of a nonflammable material (for example, asbestos or nonflammable carbon material) is interposed between the joint members (16). The sealing member is used for preventing the atmosphere gas contained in the thermal treatment zones (14a, 14b) of the muffles (10, 13) from leaking through the joint to the outside atmosphere (15) of the muffles (10, 13). In such muffle furnace, the heating zones are hardly independent from each other since the object to be treated (25) is conveyed continuously.

In the muffle furnace described above, there is such a problem that only a very small part of the thermal energy supplied by the heater (9) is utilized for heating the object to be treated, namely an effective heat efficiency is very low. The term "effective heat efficiency" means the proportion of the thermal energy which is utilized for heating of the object to be treated to the thermal energy supplied to the thermal treatment apparatus by the heater (9). In a thermal treatment apparatus having a low effective heat efficiency, most of the thermal energy supplied by the heater (9) is waste energy that is not utilized in the thermal treatment, and may be called a heat loss.

For example, in a case where the object to be treated is a product such as an electronic component or electronic device, the effective heat efficiency when heating this object is 5% or lower despite the heat capacity of the object that is generally very small. This is because the thermal treatment is applied in a uniform, stable and large thermal treatment atmosphere for the purpose of maintaining satisfactory quality and yield of the product.

The lower the effective heat efficiency, the larger the amount of thermal energy that must be supplied to the thermal treatment apparatus. This results in a higher running cost of the thermal treatment apparatus and leads to an increase in the product cost. Thus, it is desired to reduce the cost by reducing the energy supplied to the thermal treatment apparatus (namely saving the energy). Particularly, it is strongly desired to develop an energy saving design for production facilities such as the thermal treatment apparatus that consumes a large amount of thermal energy, from the viewpoint of the effect of the production activities of corporations upon the global environment.

The effective heat efficiency tends to be lower in a thermal treatment apparatus having two adjacent thermal treatment chambers wherein a larger difference in the inside temperatures between the chambers is observed. That is, in the case of the thermal treatment apparatus shown in FIG. 13, the most heat loss occurs in the joint that connects the heating muffle (10) and the cooling muffle (13). The cause of heat loss occurring when heating an object to be treated in the thermal treatment apparatus that is a muffle furnace having a heating muffle and a cooling muffle as shown in FIG. 13 is described below, along with paths of heat transfer which the heat supplied to the heating muffle follows.

Part of the heat supplied from the heating means disposed around the muffle is transmitted through a heat transfer path including the furnace wall that surrounds the muffle. The heat transmitted through the path is released from the external surface of the furnace wall to the outside. The released heat does not reach the object to be treated, and therefore entirely amounts to heat loss.

Another heat transfer path is the water that flows through the cooling water pipe disposed outside the cooling muffle. Heat released to the outside from the water flowing through the cooling water pipe includes the heat radiated from the object heated in the heating muffle and the heat radiated from the carrier heated in the heating muffle. Specifically, the heat radiated from the carrier is eventually transmitted to the atmosphere gas in the cooling muffle and to the wall of the cooling muffle, or transmitted through contact of the carrier and the cooling muffle or thermal radiation occurring between the carrier and the cooling muffle wall to the wall of the cooling muffle. From the wall of cooling muffle, the heat is transmitted to the water that flows through the cooling water pipe disposed outside the cooling muffle so as to heat the water, and then, is released to the outside of the furnace.

Another path of heat transfer is the atmosphere gas. Release of heat through this path means that the heat is carried to the outside of the furnace by the supply and exhaust of the atmosphere gas. All the heat released in this manner amounts to heat loss. The amount of heat carried outside by the atmosphere gas varies depending on the method of applying the thermal treatment. When the thermal treatment is applied, for example, as a drying process for evaporating an organic solvent or the like, a larger amount of atmosphere gas is supplied and exhausted and the amount of heat removed also increases accordingly. When the quantity of solvent evaporated during the thermal treatment is small (for example, when a ceramic material is calcinated), on the other hand, a smaller quantity of the atmosphere gas is required to be supplied and exhausted. Therefore, the amount of heat carried to the outside of the furnace is much smaller than that released through the furnace wall and the cooling water.

Of the input thermal energy (100%) supplied to the thermal treatment apparatus such as the muffle furnace, a proportion of the thermal energy released through each of heat transfer paths described above varies depending on the type and operating conditions of the thermal treatment apparatus (such as a temperature, quantities of an atmosphere gas charged in and discharge from the thermal treatment zones, a transporting speed of the object to be treated and type of the object). In the case of a muffle structure heating furnace commonly used in electronic component manufacturing plants, for example, thermal energy released through the wall surface of the furnace is around 20 to 30% of the input thermal energy, while thermal energy released to the outside of the furnace by the cooling water is around 70 to 80% of the input thermal energy. Heat carried to the outside by the atmosphere gas is in a range from several percents to several tens of percents of the input thermal energy, depending on the discharging conditions of the atmosphere gas. The proportion of the thermal energy released through each heat transfer path can be calculated from the input energy, the temperatures in the thermal treatment chambers, temperature of the object to be treated, temperature and flow rate of the water flowing in the cooling water pipe and other data.

The reason for the greater proportion of the heat carried by the cooling water to the outside of the furnace may be due to the large amount of heat released from the carrier. The carrier is usually heated to the same temperature as the atmosphere gas in order to maintain the constant temperature around the object to be treated in the heating zone. The carrier is generally designed into such a construction that has a high strength at a high temperature so as to be capable of carrying the object in the thermal treatment space. As a result, the carrier tends to be large in size, and the heat capacity of the carrier inevitably becomes large accordingly. The larger the heat capacity, the larger the energy required to raise the temperature. Consequently, when the carrier is cooled down, a large amount of heat stored in the carrier is released. The carrier is indispensable for transporting the object to be treated into the atmosphere of the desired temperature in the thermal treatment apparatus. However, since the thermal energy released from the carrier has been supplied thereto merely for the purpose of maintaining the constant temperature around the object in the heating zone, it constitutes the heat loss. This heat loss typically accounts for around 20 to 30% of the input thermal energy.

The cause and amount of heat loss have been elucidated to some extent as described above, although not fully investigated. For example, on the assumption that the heat transmitted to the object is released in the cooling zone, when the heat released from the object to be treated and the heat released from the carrier are deducted from the heat carried by the cooling water to the outside of the furnace, the rest of the heat is about 30 to 50% of the input energy. However, the rest of the heat has not been closely studied with regard to the transfer path thereof.

SUMMARY OF INVENTION

The present invention has been made in consideration of the circumstances described above, and an object thereof is to provide a thermal treatment apparatus having an improved effective heat efficiency by elucidating the structural problem of the thermal treatment apparatus by finding out the causes of the heat loss and determining the contribution of each cause to the heat loss.

The present inventors have intensively studied about the heat loss. Through the study, it has been found that, of the heat released from the water that flows through the cooling water pipe in the muffle furnace described above, heat corresponding to about 25 to 45% of the input thermal energy is caused by the thermal conduction from the muffle wall that defines the heating zone to the muffle wall that defines the cooling zone. The present inventors have completed the thermal treatment apparatus of the present invention that involves a smaller heat loss than that of the prior art by providing the thermal treatment apparatus with means for effectively suppressing the thermal conduction.

The present inventors have also found that heat corresponding to about 5 to 20% of the input thermal energy is caused by the convection between the atmosphere in the heating muffle and the atmosphere in the cooling muffle, and radiation heat transfer from the inside surface of the heating muffle wall to the cooling zone. Accordingly, the present inventors have completed the thermal treatment apparatus of the present invention in which the heat loss is still smaller, by providing means for effectively suppressing the heat transmission through convection and radiation along with the means for suppressing the thermal conduction between the muffles.

FIG. 12 shows an example of a heat balance diagram in an electrically heated muffle furnace of the prior art, which diagram the present inventors have built according to the newly obtained finding. FIG. 12 is a heat balance diagram with respect to a thermal treatment wherein an object is calcinated and no evaporation is accompanied and accordingly only a small quantity of atmosphere gas is charged and discharged. The heat balance diagram shown is merely an example, and the proportion of released heat varies depending on such factors as the type of thermal treatment and operating conditions of the furnace.

As used herein, the term "thermal treatment" refers to a treatment of heating the object to be treated, maintaining or decreasing a temperature of the object, or any combination thereof. Thus, it should be noted that the thermal treatment may be raising or lowering the temperature of the object, maintaining the object at a constant temperature or a combination of any of these, and therefore the thermal treatment may be a supply of heat to the object to be treated, removal of heat therefrom or any combination of these (including optional thermal insulation of the object). Through the thermal treatment, predetermined change is caused in at least one of properties of the object to be treated (such as a moisture content, a weight, an electrical resistivity, a permeability, a thickness of a resulted film or its uniformity, an internal stress or strain, a strength, a composition or the like).

The treatment in which heat is supplied to the object to be treated (i.e. heating treatment) includes, for example, a treatment of raising the temperature of the object to a predetermined level in a predetermined period of time, a treatment of maintaining the object at the predetermined temperature for a predetermined period and a treatment of subjecting the object to temperature change in a predetermined manor. The treatment in which heat is removed from the object to be treated (i.e. cooling treatment) includes a treatment in which heat is not supplied, namely a spontaneous cooling treatment, and a forced cooling treatment for lowering the temperature of the object by blowing cool air using power or not by means of a heat absorbing or heat radiating surface that can be controlled to a predetermined temperature. Also the cooling treatment includes the slow cooling described previously. In a case where the object to be treated is cooled gradually, the object may be subjected to a cooling treatment in a thermal treatment zone that is heated by a heater or other means to a temperature lower than that of the object in order to avoid quick temperature decrease. It should be noted that a thermal treatment carried out in the thermal treatment zone that is heated is also regarded as the cooling treatment as long as the temperature of the object is decreased.

Now the thermal treatment apparatus of the present invention, namely the thermal treatment apparatus provided with means for effectively suppressing the thermal conduction between the muffle walls is described below.

The thermal treatment apparatus according to a first aspect of the present invention comprises a plurality of muffles as thermal treatment chambers so as to apply a thermal treatment to an object to be treated that is being transported through the muffles, wherein at least one pair of two adjacent muffles of which inside temperatures are different from each other are connected through a thermal insulating structural member and the thermal insulating structural member has a tunnel structure so as to allow the object to pass therethrough.

The inside temperature of the muffle is in general the temperature of the atmosphere gas contained in the muffle. Thermal conduction occurs between two muffles of which inside temperatures are different. The thermal treatment apparatus of the present invention reduces heat loss caused by the thermal conduction between muffles by interposing the thermal insulating structural member between the two muffles where such thermal conduction occurs.

The thermal insulating structural member refers to a member that is formed so as to reduce the thermal conduction between the muffles. The thermal insulating structural member has a tunnel structure so that transportation of the object to be treated between the muffles is not impeded, and the object can pass through the thermal insulating structural member.

The fact that the thermal insulating structural member has a tunnel structure means that the member has a hollow which is open at an inlet and an outlet thereof so that the object to be treated introduced through the inlet is carried outside from the outlet. That is, the thermal insulating structural member of tunnel structure has a space that is present through the thermal insulating structural member along the direction of transporting the object. Any cross section obtained by cutting the hollow at right angles to the object transporting direction does not form a completely closed plane and always has an open portion. Therefore, in a case where the thermal insulating structural member is disposed between the adjacent muffles that serve as thermal treatment chambers, the tunnel structure of the thermal insulating structural member provides a passage that communicates between the thermal treatment chambers. Such a tunnel structure can be formed by defining the hollow with a wall.

The thermal insulating structural member used in the present invention also has a substantial length (dimension) in the direction of transporting the object to be treated. In other words, the thermal insulating structural member is not a plate or sheet configuration.

The thermal insulating structural member that is provided to reduce the thermal conduction between the muffles is constructed specifically as follows.

(1) A wall of the thermal insulating structural member is made of a material that has a lower thermal conductivity than that of the material which constitutes the muffle. By using the material that has a lower thermal conductivity, thermal conduction from a heating muffle to a cooling muffle can be effectively suppressed.

(2) The thermal insulating structural member is constructed in such a configuration in which a wall thereof has a non-uniform wall thickness, namely the wall has a smaller thickness in part. When the wall has a smaller thickness in part so as to decrease the area of cross section that is perpendicular to the direction of thermal conduction, for example, the direction from the heating muffle to the cooling muffle (hereinafter the cross section is called a thermal conducting cross section), heat transfer from the heating muffle to the cooling muffle through the cross section can be effectively suppressed. The wall that has a smaller thickness in part is a wall having a recess (for example, a groove).

(3) At least a part of the thermal insulating structural member is formed of a thin plate. In other words, at least a part of wall of the thermal insulating structural member is made of a thin plate. The "thin plate" herein refers to a plate-like member that is thinner the cooling muffle wall. This thermal insulating structural member is formed of the plate-like member that has a smaller thermal conducting cross section at least in part, similar to the case of (2), and effectively suppresses thermal conduction between the muffles.

The thermal insulating structural member may be constructed with a combination of at least two of the constitutions (1) through (3). The thermal insulating structural member is preferably constituted so that it reduces the thermal energy supplied to the thermal treatment apparatus by 10% or more compared to the thermal energy supplied to a thermal treatment apparatus without the thermal insulating structural member.

In the thermal treatment apparatus of the present invention, a thermal blocking plate member is preferably disposed at at least one end of the thermal insulating structural member without impeding the passage of the object to be treated.

The thermal blocking plate member is a plate-like member that prevents convective heat transfer which could, occur between spaces separated by the plate-like member if the plate-like member is not provided, and also that provides a surface that prevents heat transfer through thermal radiation from one space to the other.

The thermal blocking plate member preferably has a surface of high thermal reflectivity such as a mirror surface, in order to minimize the heat loss due to radiation of heat from the surface.

The thermal blocking plate member is disposed at at least one end of the thermal insulating structural member. This causes a part of the hollow of the thermal insulating structural member and the thermal treatment zone in the muffle to be separated by the thermal blocking plate member at the end of the thermal insulating structural member. Each end of the thermal insulating structural member may also be regarded as the end of each muffle, which end makes contact with the thermal insulating structural member. Therefore, the embodiment having the thermal blocking plate member disposed at at least one end of the thermal insulating structural member includes an embodiment wherein the thermal blocking plate member is interposed between the thermal insulating structural member and the muffle, wherein the thermal blocking plate member is attached to the inside surface of the muffle wall by, for example, welding or bonding at the end of the muffle. The thermal blocking plate member is disposed so that the surface that prevents heat transfer forms an angle with (namely not in parallel to) the direction of heat transfer (usually the direction of transporting the object to be treated). Preferably, the surface of the thermal blocking plate member which prevents heat transfer crosses the direction of heat transfer at right angles.

Alternatively, the thermal blocking plate member may be provided inside the tunnel, namely the hollow of the thermal insulating structural member. In this case, the thermal blocking plate member is attached to the inside surface of the wall of the thermal insulating structural member by welding or bonding. Or, alternatively, the thermal blocking plate member may also be interposed between two parts which constitute the thermal insulating structural member.

The thermal blocking plate member is provided without impeding the passage of the object to be treated. Specifically, the passage of the object will not be impeded when the thermal blocking plate member is provided with an opening or a notch so that the object and a carrier, as the case may be, pass through the opening or the notch.

Use of the thermal blocking plate member makes it possible to effectively reduce heat transfer through the convection between the atmosphere in the heating muffle and the atmosphere in the cooling muffle, and through the thermal radiation from the inside surface of the heating muffle wall. Thus it is possible to further reduce the heat loss in the thermal treatment apparatus by using combination of the thermal blocking plate member and the thermal insulating structural member.

The thermal insulating structural member to be combined with the thermal blocking plate member is any one of the constitutions (1) through (3) or a combination of at least two of the constitutions (1) through (3).

While the thermal treatment apparatus including muffles as the thermal treatment chambers has been described as the first aspect of the present invention, the present invention can also be applied to a thermal treatment apparatus that has a plurality of thermal treatment chambers that are not muffles. For example, such thermal treatment apparatus has heating means or cooling means provided in the thermal treatment chamber so that the object to be treated is directly heated or cooled.

Thus, according to a second aspect of the present invention, there is provided a thermal treatment apparatus which comprises a plurality of thermal treatment chambers so as to apply a thermal treatment to an object to be treated that is being transported through the thermal treatment chambers, wherein at least one pair of two adjacent thermal treatment chambers of which inside temperatures are different from each other are connected through a thermal insulating structural member-and the thermal insulating structural member has a tunnel structure so as to allow the object to be treated to pass therethrough. The thermal treatment apparatus provided according to the second aspect of the present invention includes the thermal treatment apparatus provided according to the first aspect of the present invention. In other words, the thermal treatment apparatus provided according to the first aspect is a variation of the thermal treatment apparatus provided according to the second aspect wherein at least one pair of the two adjacent thermal treatment chambers of which inside temperatures are different from each other are muffles and the two muffles are connected through the thermal insulating structural member.

In this thermal treatment apparatus, the thermal insulating structural member is inserted between the walls that define the two thermal treatment chambers respectively, so that it effectively suppresses thermal conduction between the thermal treatment chambers. The specific constitution of the thermal insulating structural member is similar to that described previously in conjunction with the thermal insulating structural member disposed between the muffles, and is selected depending on such conditions as the material and thickness of the wall of the thermal treatment chamber.

In the thermal treatment apparatus provided according to the second aspect, as well, the thermal blocking plate member is preferably used in combination with the thermal insulating structural member. Heat loss in the thermal treatment apparatus can also be smaller in this case.

In the thermal treatment apparatus of the present invention described above, the thermal insulating structural member is disposed between the two adjacent thermal treatment chambers (muffles in the case of the muffle furnace) wherein thermal conduction takes place across the joint. Thus the thermal insulating structural member is disposed between a high temperature thermal treatment chamber and a low temperature thermal treatment chamber (between a high temperature muffle and a low temperature muffle in the case of the muffle furnace), wherein the inside temperature (generally the temperature of the atmosphere gas in the thermal treatment chamber) of one of the thermal treatment chambers is higher than that of the other.

The larger the temperature difference between the thermal treatment chambers, the larger the heat loss caused by thermal conduction, which is desired to be reduced. Therefore, when the temperature difference between the two adjacent thermal treatment chambers is larger, it is more desirable to provide the thermal insulating structural member between the thermal treatment chambers, thus achieving greater effect of decreasing the heat loss. A preferable combination of the thermal treatment chambers between which the thermal insulating structural member is disposed is, for example, a combination wherein one thermal treatment chamber is a heating chamber or a slow cooling chamber of which an inside of is heated by a heater or the like to 400° C. or higher, and the other thermal treatment chamber is a cooling chamber (quenching chamber) that is cooled by means of a cooling medium such as water so that the inside temperature thereof is around room temperature.

Even when both of the two adjacent thermal treatment chambers are heated by a heater or the like, a temperature in one of the thermal treatment chambers may be set to be higher than that of the other by several tens of degrees Celsius (for example 20° C.). As such a combination of the two adjacent thermal treatment chambers, there is a combination of a heating chamber that is heated to a lower temperature and a heating chamber that is heated to a higher temperature. The thermal insulating structural member may be disposed between such two thermal treatment chambers that adjoin each other.

When the thermal blocking plate member is used, the thermal blocking plate member is preferably disposed at the end of the thermal insulating structural member which makes contact with the thermal treatment chamber having a higher inside temperature (heating chamber). Heat loss can be made smaller by providing the thermal blocking plate member near the thermal treatment chamber of higher temperature.

The effects that can be achieved by the thermal treatment apparatus of the present invention are as follows. The thermal treatment apparatus of the present invention is characterized by the thermal insulating structural member disposed between the two adjacent thermal treatment chambers (for example, muffles) and, as the case may be, the thermal blocking plate member disposed therein. As this constitution reduces the heat loss in the thermal treatment apparatus (for example, muffle structure heating furnace), total thermal energy consumed in the thermal treatment apparatus can be reduced. According to the present invention, therefore, energy saving in the operation can be achieved and the products can be manufactured with lower running cost without adversely affecting the quality and yield of the products subjected to the thermal treatment.

The thermal insulating structural member and the thermal blocking plate member do not include any member that is moved (for example, up and down) mechanically by means of a motor or the like. As a result, the thermal treatment apparatus of the present invention achieves the effects described above satisfactorily even when the temperature in one of the two adjacent thermal treatment chambers is so high as to make it difficult for the motor or the like to make mechanical movement.

Moreover, the thermal insulating structural member and the thermal blocking plate member can suppress the thermal conduction between the two adjacent thermal treatment chambers without allowing the atmosphere gas in the thermal treatment chambers to leak to the outside of the thermal treatment chambers. Therefore, the thermal treatment apparatus of the present invention can stably apply a thermal treatment to the object to be treated with a higher effective heat efficiency without disturbing the atmosphere gas in the thermal treatment chambers.

BRIEF DESCRIPTION OF DRAWINGS

FIG. 9 is a schematic sectional view showing part of further another example of a thermal treatment apparatus of the present invention wherein a thermal insulating structural member is disposed between a heating muffle and a cooling muffle and a thermal blocking plate member is disposed between the heating muffle and the thermal insulating structural member;

FIG. 11 is a graph that compares an electric power consumption between a thermal treatment apparatus of the present invention and a thermal treatment apparatus of the prior art;

FIG. 14 shows a sectional view schematically showing the joint between the muffles in the muffle structure heating furnace of the prior art.

EMBODIMENT OF THE INVENTION

The thermal treatment apparatus according to the first aspect of the present invention comprises a plurality of muffles as thermal treatment chambers so as to apply thermal treatment to an object to be treated that is transported through the muffles. In the thermal treatment apparatus of such a constitution, all the thermal treatment chambers may be muffles, or only a part of the thermal treatment chambers may be muffles. The thermal treatment apparatus includes one or more heating zone and/or one or more cooling zone depending on the type of thermal treatment. The thermal treatment apparatus includes a temperature raising zone and optionally a thermostatic zone as the heating zone.

The heating zone and the cooling zone may be disposed in any combination so that the object to be treated can be subjected to a desired thermal treatment. For example, one or more heating zone and one or more cooling zone may be arranged in this order along the direction of transporting the object to be treated so that the object is heated, then cooled down and carried out of the thermal treatment apparatus. Alternatively, one or more heating zone and one or more cooling zone may be disposed alternately. Also such a configuration may be employed as three thermal treatment zones are arranged in the following order as a heating zone for raising the temperature of the object to be treated, a heating zone for maintaining the temperature thereof and a cooling zone, so that the object passes through the temperature raising zone, the thermostatic zone and the temperature lowering zone in this order. In addition, any arrangement of the thermal treatment zones employed in the muffle furnace of the prior art may be employed.

In the thermal treatment apparatus according to the first aspect of the present invention, the thermal insulating structural member is provided between two adjacent muffles wherein a large amount of heat is transmitted across the joint (for example between muffles of which inside temperatures are different by 800° C. or more). A preferable embodiment of the thermal insulating structural member is described below with reference to the accompanying drawings.

Figure 1:
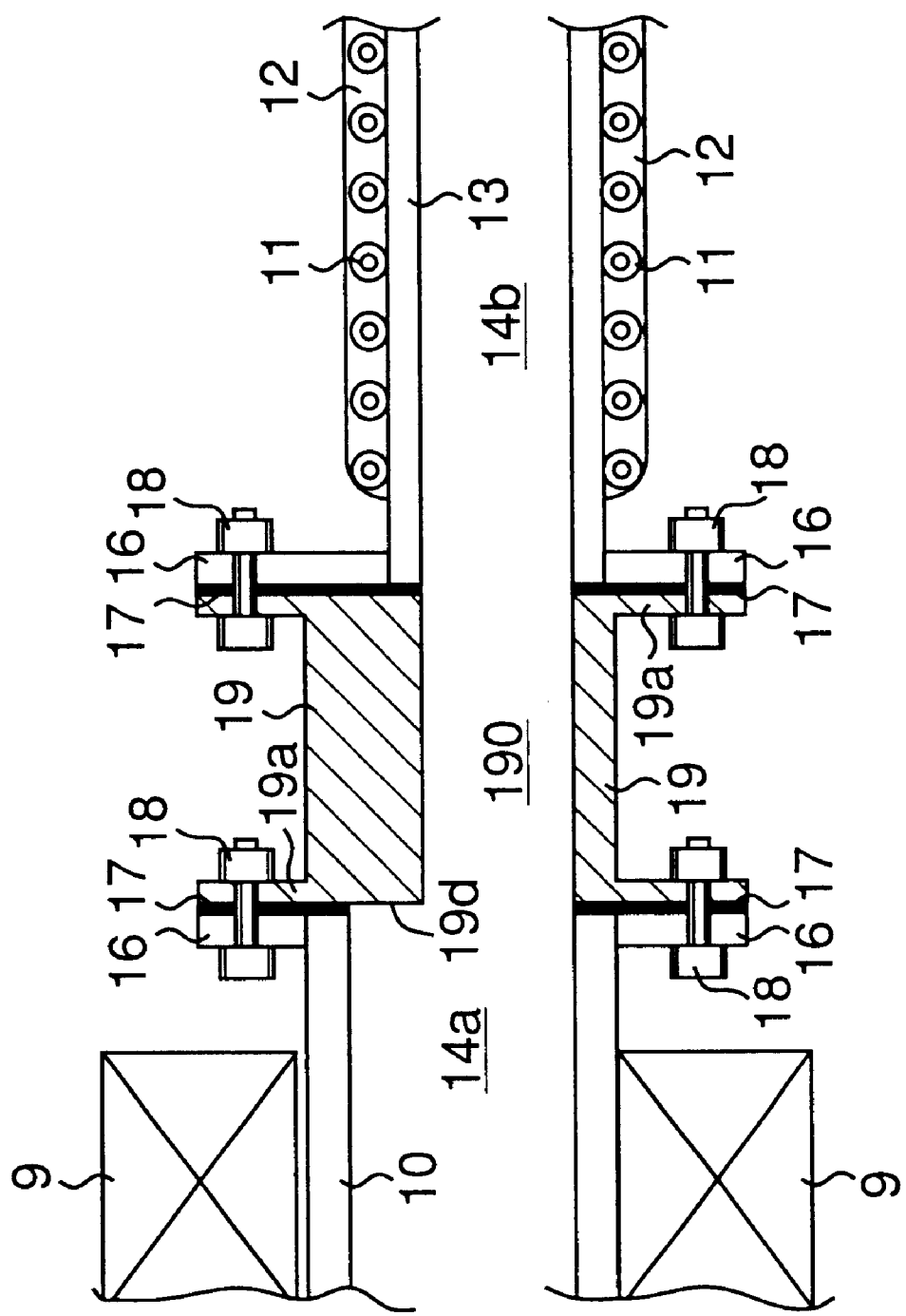
FIG. 1 is a schematic sectional view showing a part of an example of a thermal treatment apparatus of the present invention wherein a thermal insulating structural member is disposed between a heating muffle and a cooling muffle.

FIG. 1 shows an example of a thermal insulating structural member (19) that is disposed between a heating muffle (10) and a cooling muffle (13) and is formed of a wall made of a material that has a lower thermal conductivity than that of material which constitutes the muffle. FIG. 1 schematically shows the joint between the heating muffle (10) and the cooling muffle (13) similar to FIG. 14, and reference numerals used in FIG. 1 which are identical to those used in FIG. 14 denote identical components as those in FIG. 14.

In the embodiment shown in the drawing, the object to be treated moves in the muffles in the x direction on a plane parallel to the x-y plane in FIG. 1. The y direction is perpendicular to the plane of the drawing sheet. The heating muffle (10) and the cooling muffle (13) have thermal treatment zones (14a, 14b), respectively, that are hollow spaces which exist therethrough in the x direction so that the object can move therein. In the embodiment shown in the drawing, the heating muffle (10) has a tunnel structure of which a cross section perpendicular to the direction in which the thermal treatment zone (14a) extends (the x direction in the drawing) (hereinafter the term "cross section" used with respect to the hollow shall mean this cross section unless otherwise specified) and has an arch or rectangular shape, while the cooling muffle (13) has a tunnel structure in which a cross section of a thermal treatment zone (14b) has an arch or rectangular shape. The cross sectional area of the thermal treatment zone (14a) of the heating muffle (10) is larger than that of the thermal treatment zone (14b) of the cooling muffle (13).

The heating muffle (10) and the cooling muffle (13) have a heater (9) and a cooling water pipe (11), respectively, disposed on two external surfaces of the wall which are parallel to the x-y plane. The object to be treated is heated to a high temperature (for example, 800° C.) by the heating muffle (10) and is then cooled down to a temperature near room temperature in the cooling muffle (13). Thus the inside of the cooling muffle (13) corresponds to a quenching zone.

The material that constitutes the wall of the thermal insulating structural member (19) is selected depending on the material(s) that constitute the heating muffle (10) and the cooling muffle (13), so as to have a lower thermal conductivity than that of the material(s) of the heating muffle (10) and the cooling muffle (13).

In a typical muffle furnace, the muffle is made of a metallic material such as stainless steel or Inconel. Therefore, the thermal insulating structural member (19) is desirably constructed from a wall made of a material having a thermal conductivity lower than the thermal conductivity of these materials, specifically an inorganic material selected from a ceramic material, silica, brick and the like, or a porous material (for example, a material obtained by sintering hollow bodies or glass beads) made from these inorganic materials.

The thermal insulating structural member (19) also has a tunnel structure having a hollow (190) that is present through in the x direction so that the object to be treated moves therein. In the embodiment shown in the drawing, the hollow (190) of the thermal insulating structural member (19) is formed so as to be identical with the cross section of the thermal treatment zone (14b) of the cooling muffle (13), and is disposed so that the inside surface of the wall of the cooling muffle (13) and the inside surface of the wall of the thermal insulating structural member (19) are flush. Accordingly, a part (19d) of the end face of the thermal insulating structural member (19) is exposed in the heating zone. The part (19d) exposed in the heating zone prevents the atmosphere gas contained in the heating muffle (10) from moving into the cooling muffle (13). In the thermal insulating structural member (19), one of the walls parallel to the x-y plane (upper wall in FIG. 1) is thicker than the other.

The thermal insulating structural member (19) has a flange (19a) as a joint member at an end thereof for the connection with each muffle. A joint member (16) of the muffle and the joint member (19a) of the thermal insulating structural member are mechanically connected by means of bolts/nuts (18). Interposed between the joint member (16) of the muffles and the joint member (19a) of the thermal insulating structural member is a sealing member (17) made of a nonflammable material (for example, asbestos, or nonflammable carbon material). This is provided for the purpose of preventing the atmosphere gas within the muffles (10, 13) from leaking through each joint between each muffle and the thermal insulating structural member.

Figure 2:
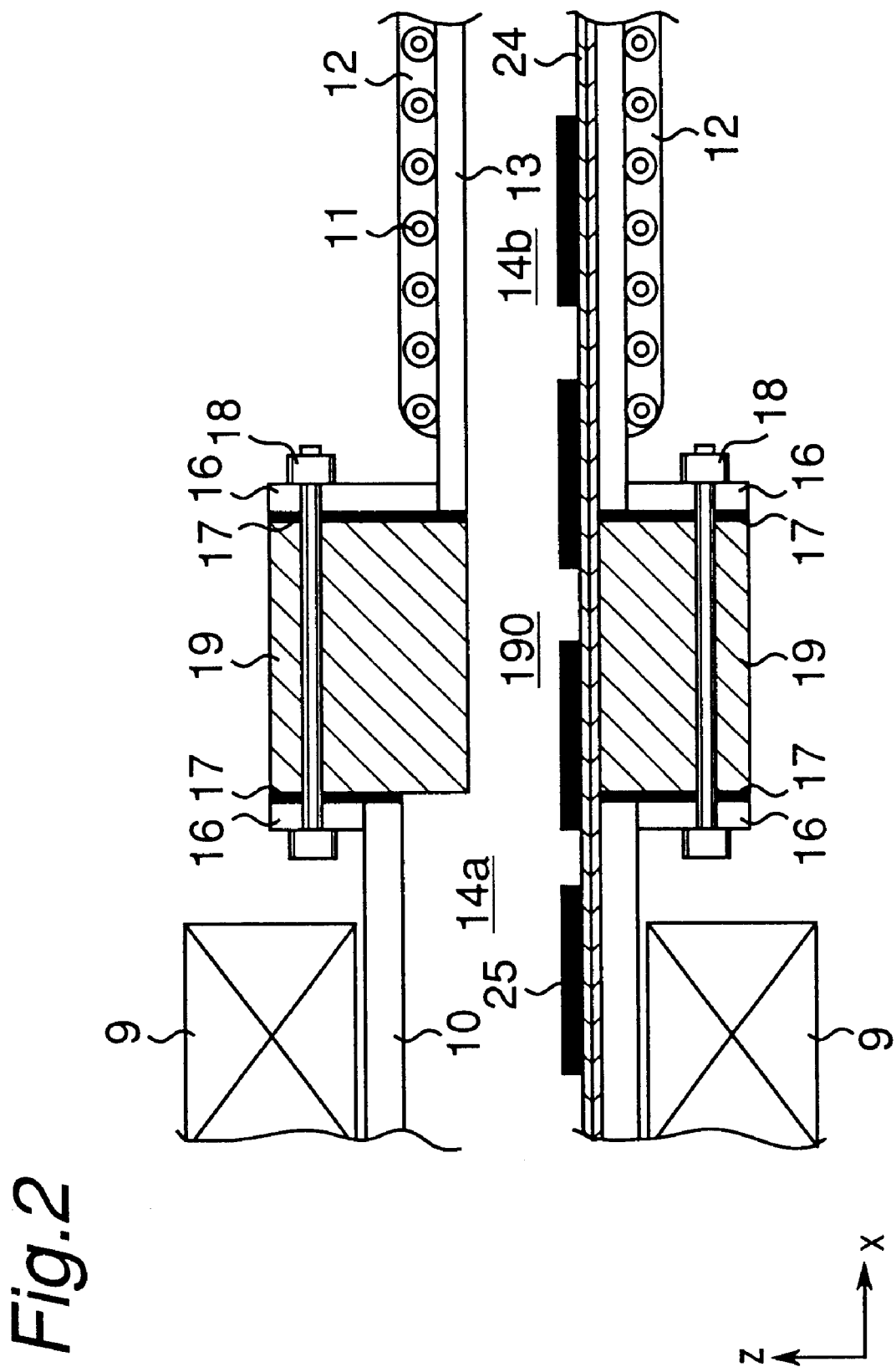
FIG. 2 is a schematic sectional view showing part of another example of a thermal treatment apparatus of the present invention wherein a thermal insulating structural member is disposed between a heating muffle and a cooling muffle.

The thermal insulating structural member shown in FIG. 1 is a mere example of the thermal insulating structural members that are constituted by using a material having a lower thermal conductivity. Another example is shown in FIG. 2. In FIG. 2, reference numerals which are identical to those used in FIG. 1 denote identical components as those in FIG. 1. FIG. 2 also shows a carrier (mesh belt) (24) and an object (25) to be treated that are not shown in FIG. 1.

The thermal insulating structural member made of a material having a lower thermal conductivity may have any shape and dimensions as long as the thermal treatment process and the mechanical strength of the thermal treatment apparatus as a whole are not adversely affected and thermal conduction between the muffles can be effectively suppressed. The thermal insulating structural member may be designed by paying consideration to the muffle size, difference in inside temperature (temperature of the atmosphere gas) between the adjacent thermal treatment chambers and a required extent of suppressing the thermal conduction between the muffles. For example, the cross section of the hollow may be a rectangle, circular, semi-circular or an arch. In general, thermal conduction between the muffles can be suppressed more effectively and heat loss can be decreased more as the thermal insulating structural member is longer (in the direction of transporting the object to be treated) and the wall of the thermal insulating structural member is thinner.

For example, the thermal insulating structural member is preferably made in such a configuration as the cross section of the hollow has a semicircular shape (or arcade shape), a length of 100 to 300 m and a wall thickness of 10 to 30 mm. However, this is a mere example, and shape and size of the thermal insulating structural member can be selected depending on the kind of object to be treated and other conditions.

Figure 3:
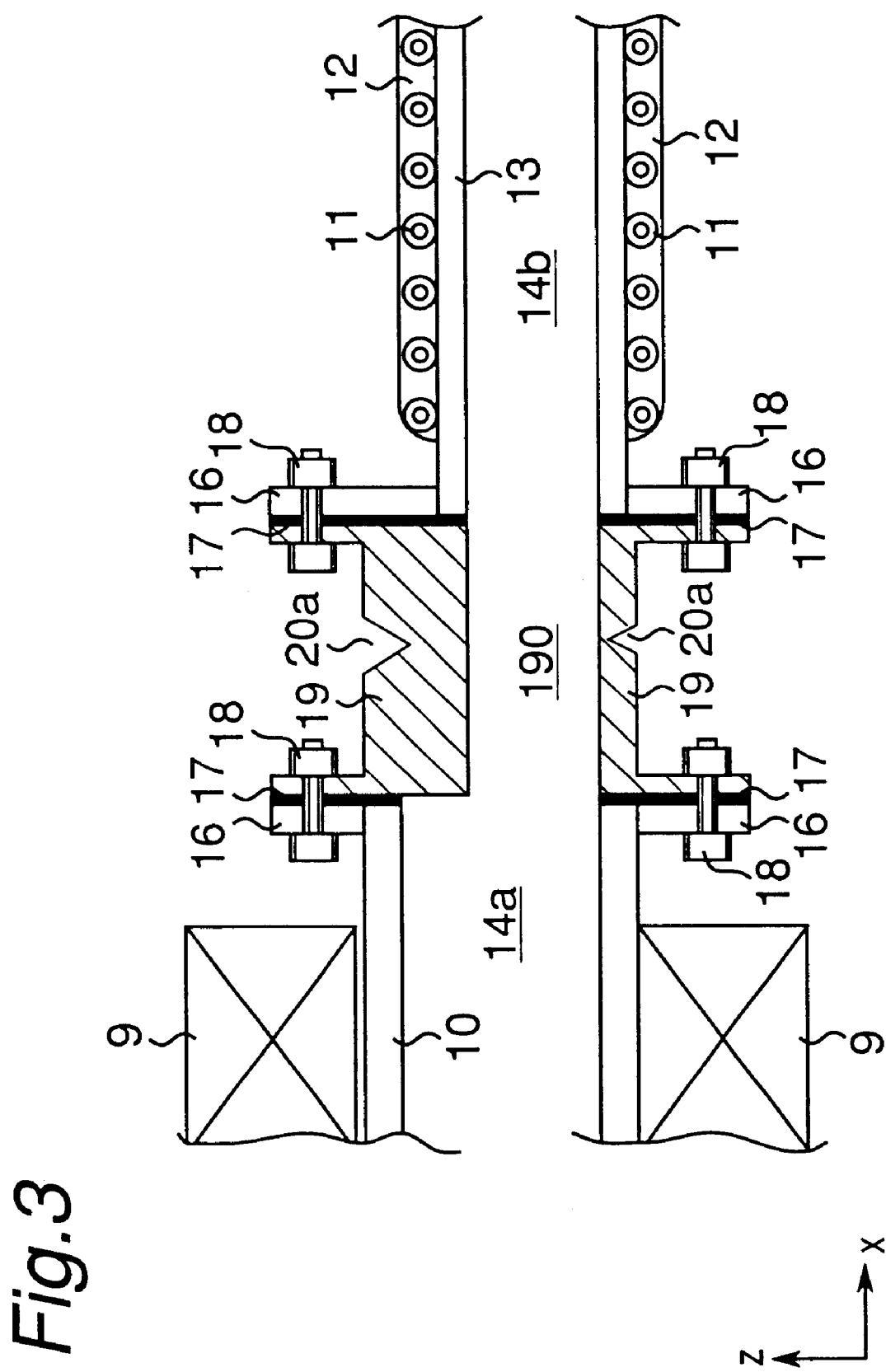
FIG. 3 is a schematic sectional view showing a part of further another example of, a thermal treatment apparatus of the present invention wherein a thermal insulating structural member is disposed between a heating muffle and a cooling muffle.

FIG. 3 shows an example of a thermal insulating structural member that is disposed between the muffles and has a wall of non-uniform thickness. Reference numerals used in FIG. 3 which are identical to those used in FIG. 1 denote identical components as those in FIG. 1.

The thermal insulating structural member shown in FIG. 3 has such a configuration wherein a groove-shaped recess (20a) extending in the y direction is provided on the external surface of each wall parallel to the x-y plane of the thermal insulating structural member shown in FIG. 1. Accordingly, wall thickness is smaller in the portion of the recess (20a) to make the area of the thermal conducting cross section smaller, thus decreasing the amount of heat transmitted.

Shape, depth, number and direction of the recesses are not limited to a particular shape, depth, number and direction as long as the thermal treatment process and the mechanical strength of the thermal treatment apparatus as a whole are not affected adversely and thermal conduction between the muffles can be effectively suppressed. For example, the groove-shaped recess may be rectangular instead of the wedge shape as shown in FIG. 3. The groove-shaped recess may extend in the x direction instead of the y direction. In general, as the recesses are deeper and the number of recesses is larger, thermal conduction between the muffles can be suppressed more effectively and therefore, heat loss can be decreased.

The recess may be located at any position of the wall of the thermal insulating structural member. For example, in a case where the thermal insulating structural member is a square tube having a hollow of which cross section is rectangular or square, it suffices to provide at least one recess on at least one of the four walls that form the thermal insulating structural member. The recess is preferably provided near the heating muffle (high temperature muffle). The recess may also be provided on the inside surface in addition to the external surface of the wall of the thermal insulating structural member. Alternatively, the recess may be provided only on the inside surface of the wall of the thermal insulating structural member, or on both the external surface and the inside surface.

The recess can be formed by cutting the wall that constitutes the thermal insulating structural member. Alternatively, a wall formed to have the recess may also be used.

The recess is preferably a groove having a wedge-shaped cross section of about 30 to 50 mm in width and about 5 to 15 mm in depth, and extends along the circumference of the cross section of the hollow (i.e., surrounds the hollow). Preferably, 2 to 5 recesses of such a configuration are provided for each thermal insulating structural member.

Figure 4:
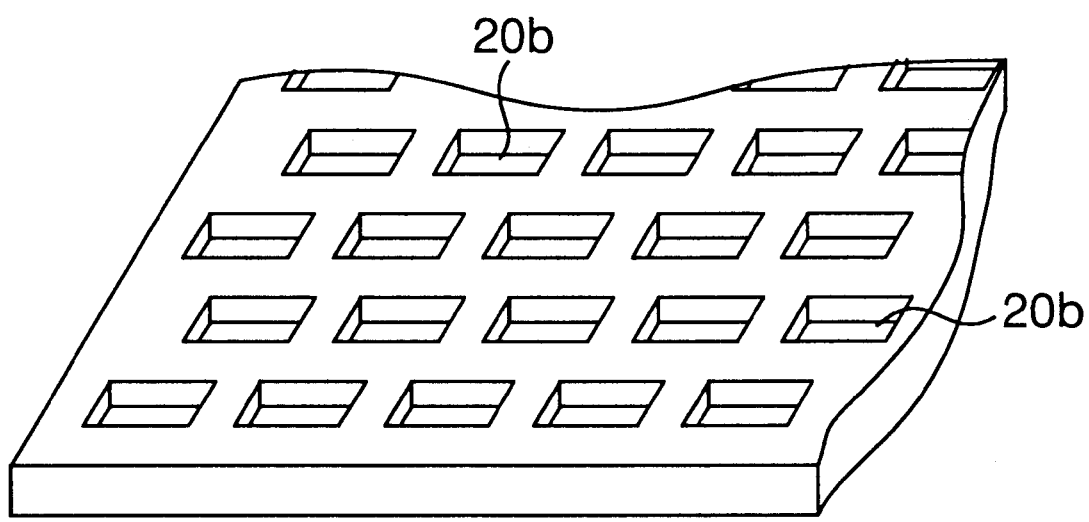
FIG. 4 is a perspective view schematically showing an example of a wall of a thermal insulating structural member that has recesses.

The wall of the thermal insulating structural member that has the groove-shaped recess is one embodiment of the thermal insulating structural member that has a non-uniform thickness. Another example of the wall that has a non-uniform thickness is a wall having a plurality of small recesses (20b) on the external surface and/or inside surface of the wall as shown in FIG. 4.

The wall of the thermal insulating structural member that has a non-uniform thickness is preferably made of a material that has a lower thermal conductivity than that of the material which constitutes the muffle. The thermal insulating structural member formed of such wall makes it possible to effectively suppress thermal conduction between the muffles.

Figure 5:
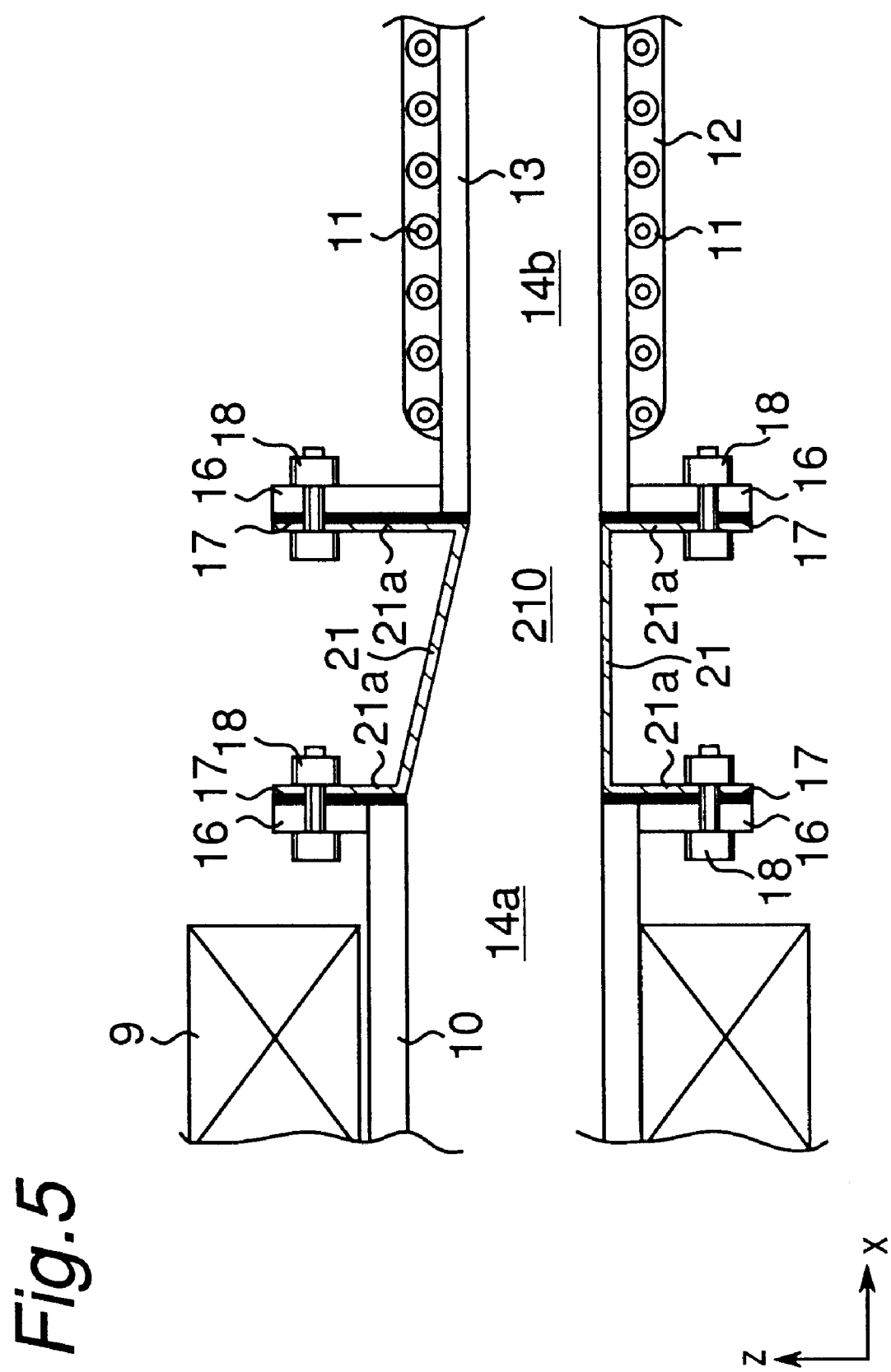
FIG. 5 is a schematic sectional view showing a part of further another example of a thermal treatment apparatus of the present invention wherein a thermal insulating structural member comprising a thin plate is disposed between a heating muffle and a cooling muffle.
Figure 6:
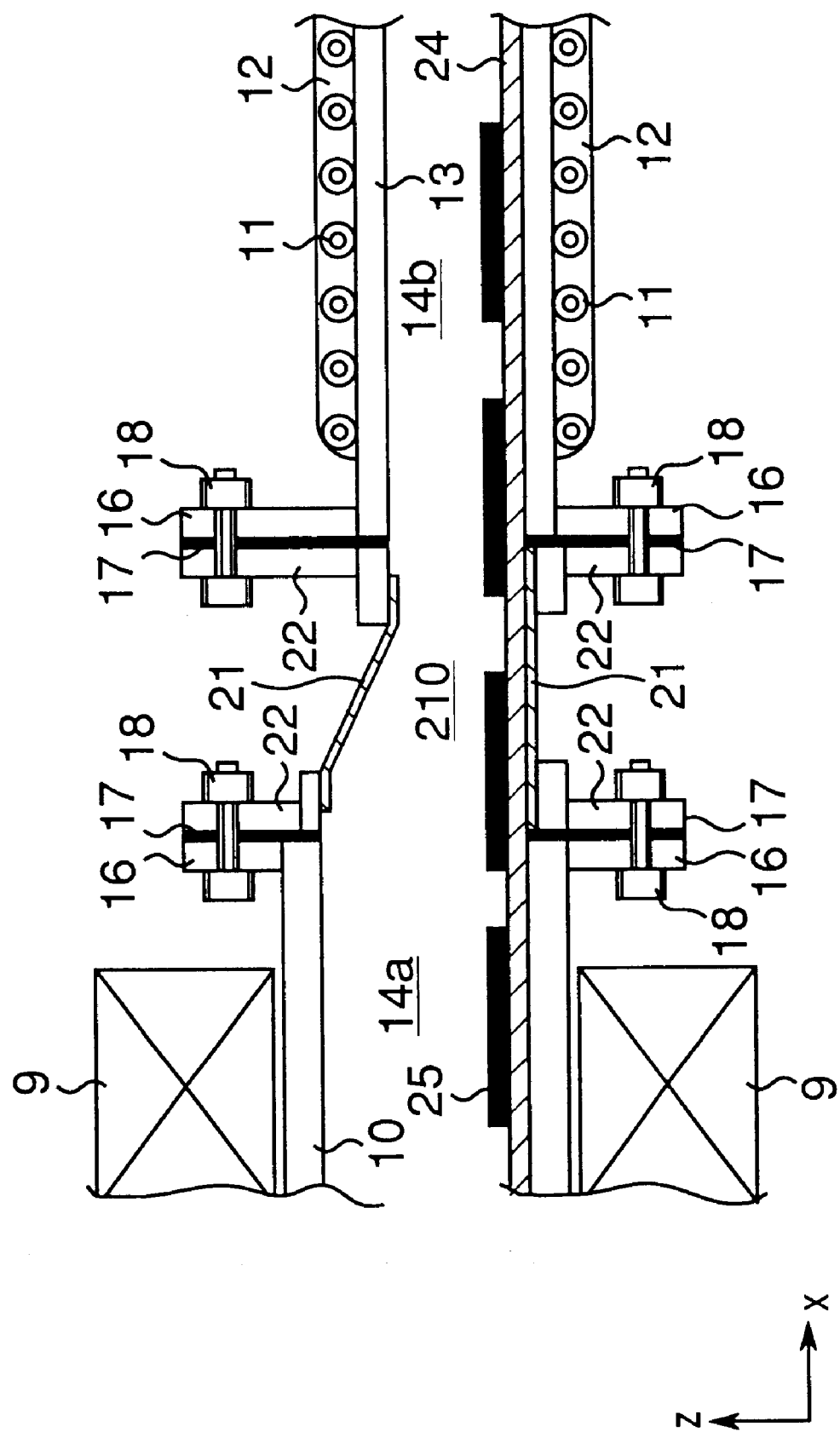
FIG. 6 is a schematic sectional view showing a part of further another example of a thermal treatment apparatus of the present invention wherein a thermal insulating structural member comprising another tin plate is disposed between a heating muffle and a cooling muffle.

FIG. 5, as well as FIG. 6, show an example of the thermal insulating structural member that is formed of thin plate as a whole and is disposed between the heating muffle (10) and the cooling muffle (13). In FIG. 5 and FIG. 6, reference numerals which are identical to those used in FIG. 1 and FIG. 2 denote identical components as those in FIG. 1 and FIG. 2. The embodiment of the thermal insulating structural member has a small thermal conducting cross sectional area throughout the entire wall and thereby effectively suppresses thermal conduction between the muffles.

In FIG. 5, the thermal insulating structural member (21) is formed of a thin plate as a whole and has a hollow (210) that is present therethrough in the x direction. The hollow (210) has a rectangular cross section. The thermal insulating structural member (21) has a flange (21a) that is formed by bending the thin plate. By adjusting the bending angle of the flange (21a), cross sections on both ends of the hollow (210) are caused to match the cross sections of the thermal treatment zones (14a, 14b) of the heating muffle (10) and the cooling muffle (13).

In FIG. 6, the thermal insulating structural member (21) formed of a thin plate is connected to a joint member (16) of the muffle by means of a connecting member (22). The thermal insulating structural member (21) is fixed on the connecting member (22) with proper means (for example, heat resistant adhesive, caulking, welding or the like). The connecting member (22) is made of, for example, the same material as the material that constitutes the muffle (for example, stainless steel).

There is no limitation to the shape, size and material of the thermal insulating structural member comprising at least partially a thin plate, as long as the thermal treatment process and the mechanical strength of the thermal treatment apparatus as a whole are not adversely affected and thermal conduction between the muffles can be effectively suppressed. However, since the thin plate portion of the thermal insulating structural member tends to have a smaller mechanical strength, care must be exercised with this regard when the thin plate is used.

Thickness of the thin plate is smaller than the thickness of the wall that constitutes the muffle. When the thickness of the wall that constitutes the muffle is not constant, thickness of the thin plate is preferably smaller than the thickness of the thinnest portion of the muffle wall. The thinner the thin plate, the smaller the thermal energy hat is transmitted between the muffles. Thickness of the thin plate is preferably in a range of 1/2 to 1/50, and more preferably from 1/10 to 1/20 of the thickness of the muffle wall.

Since the thermal conducting cross sectional area of the thin plate is sufficiently small so as to make the thermal energy transmitted between the muffles smaller, thermal conductivity of the material that constitutes the thin plate does not have significant influence on the thermal conduction between the muffles. Therefore, there is no limitation to the material that constitutes the thin plate. For example, the thin plate may be made of the same material as that constituting the muffle, and specifically stainless steel or Inconel. The thin plate may also be made of a material having a low thermal conductivity, such as ceramics, carbon or quartz glass. The thin plate may be a meshed member for filtering made of the material described above which does not substantially allow gas to pass therethrough when there is no pressure difference. Alternatively, the thin plate may be a meshed member covered with a metal foil or a laminate of a plurality of meshed members. The thin plate may be made of a heat-resistant resin, when the thermal treatment temperature is low or the mechanical strength thereof is not lowered by heat.

The thin plate may constitute only a part of the thermal insulating structural member. For example, a part of the thermal insulating structural member may be formed of the thin plate with another part being formed of a thick wall made of a material having a low thermal conductivity, so that sufficient mechanical strength of the thermal treatment apparatus can be ensured. For example, in a case where the thermal insulating structural member has a shape of a rectangular tube having a hollow of rectangular or square cross section, the thin plate may constitute a pair of opposing walls, while the other pair of walls are thick walls (for example, of a thickness equal to or larger than the thickness of the muffle wall) made of a material of a low thermal conductivity.

When heated during the thermal treatment process, the muffle may undergo elongation and thermal deformation that cause stress concentration in the joint between the muffles, thus resulting in a gap generated between the muffles which allows the atmosphere gas to leak from the inside of the muffle to the outside. Such leakage is likely to occur in the joint between the muffle and the thermal insulating structural member in a case where the thermal insulating structural member is provided between the muffles. Leakage of the atmosphere gas from the inside of the muffle causes such troubles as rusting of the apparatus when the gas is corrosive, and a health hazard to humans when the gas is toxic. Such troubles can be avoided by making the thermal insulating structural member in such a structure that can easily change its shape. That is, the stress concentration in the joint can be mitigated even when the muffles elongate or deform, by using a thermal insulating structural member which has flexibility in its shape, as a stress absorber.

Figure 7:
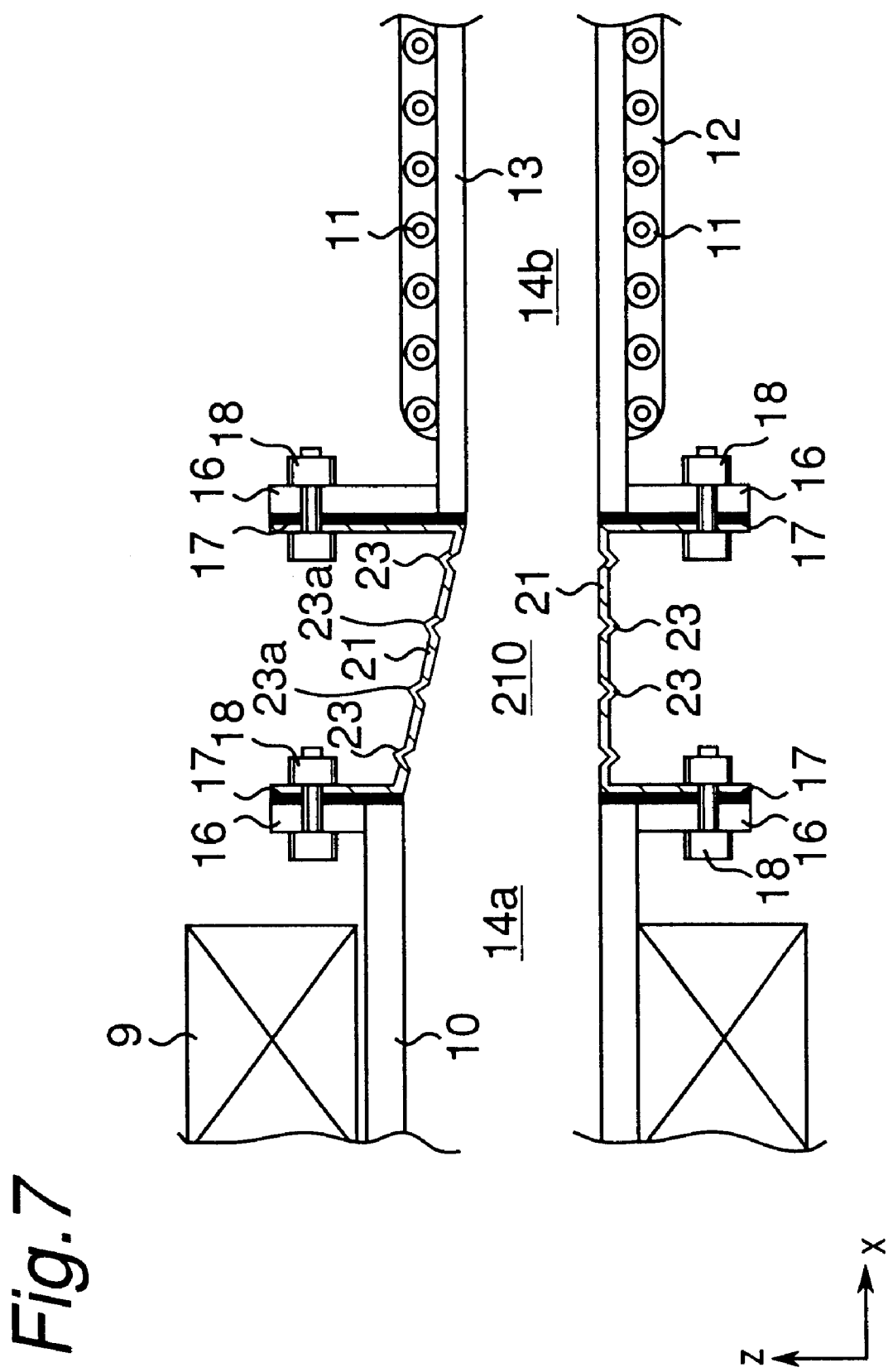
FIG. 7 is a schematic sectional view showing a part of further another example of a thermal treatment apparatus of the present invention wherein a deformable thermal insulating structural member is disposed between a heating muffle and a cooling muffle.

Specifically, the thermal insulating structural member is preferably made in such a structure as shown in FIG. 7. FIG. 7 shows an example of the thermal insulating structural member formed of a thin plate as a whole and can change its shape. In FIG. 7, reference numerals which are identical to those used in FIG. 5 denote identical components as those in FIG. 5.

The thermal insulating structural member (21) shown in FIG. 7 is formed by using a thin plate having a plurality of bent portions (23) and is constructed so that a rib (23a) of the bent portion (23) is perpendicular to the direction of transporting the object to be treated. The bent portion (23) deforms immediately when the muffle has undergone elongation and/or thermal deformation so as to prevent stress from concentrating in the joint between the muffle and the thermal insulating structural member. While the rib of the bent portion preferably extends in the direction perpendicular to the direction of transporting the object as shown in the drawing, the rib may extend in any direction other than the direction parallel to the direction of transporting the object. The bent portion may be formed in such a manner as the rib is formed in the inside surface of the wall of the thermal insulating structural member. The rib of the bent portion may be a warped portion, a top of which is not pointed.

Figure 8:
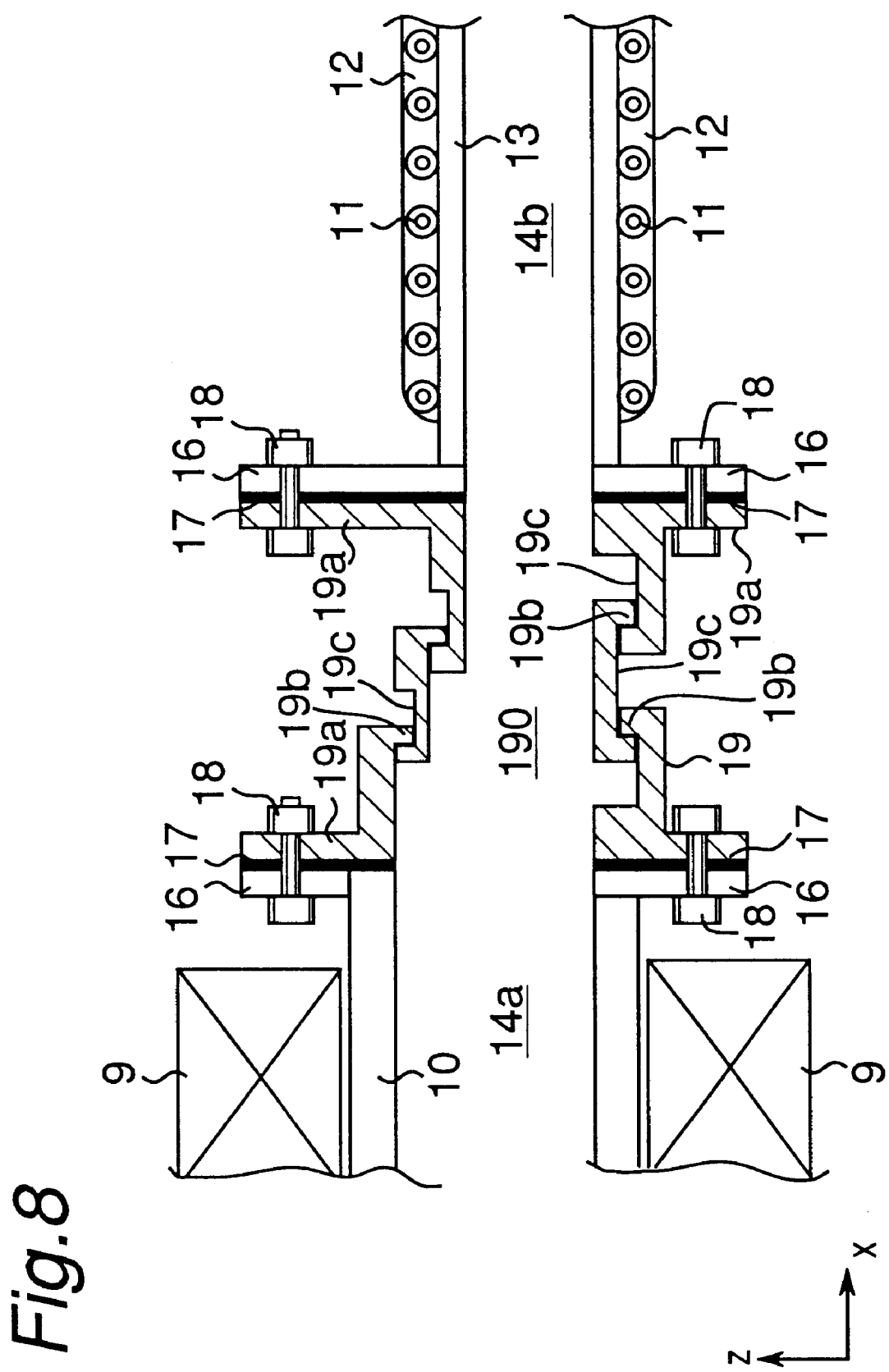
FIG. 8 is a schematic sectional view showing a part of further another example of a thermal treatment apparatus of the present invention wherein another deformable thermal insulating structural member is disposed between a heating muffle and a cooling muffle.

An example of another embodiment of the thermal insulating structural member that can change its shape is shown in FIG. 8. In FIG. 8, reference numerals which are identical to those used in FIG. 1 denote identical components as those in FIG. 1. The thermal insulating structural member (19) shown in FIG. 8 is made of a material having a lower thermal conductivity than that of the material which constitutes the muffle, similar to the apparatus shown in FIG. 1. The length of the thermal insulating structural member (19) shown in FIG. 8 contracts and extends as a hook portion (19b) slides in a recess (19c) so as to absorb the muffle elongation caused in the x direction in the muffle.

The thermal insulating structural member that can easily change in shape is useful also as means for preventing the atmosphere gas leakage which can occur in the joint between the muffles. That is, the thermal insulating structural member that can easily deform may be disposed between the muffles as a connecting structural member that improves sealing of the joint between the muffles, in addition to as a member that suppresses the thermal conduction between the muffles.

Figure 10A:
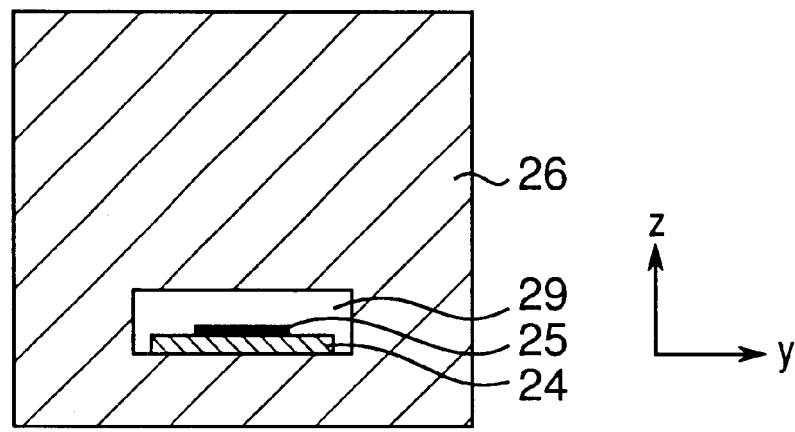
FIGS. 10A to 10C are front views schematically showing examples of a thermal blocking plate member viewed in the direction of the object movement.

Now the thermal treatment apparatus that has a thermal blocking plate member (26) in addition to the thermal insulating structural member is described below. FIG. 9 shows an example of the thermal treatment apparatus that includes the thermal blocking plate member (26), and corresponds to the thermal treatment apparatus shown in FIG. 6 having the thermal blocking plate member disposed therein. Reference numerals used in FIG. 9 which are identical to those used in FIG. 6 denote identical components as those in FIG. 6. FIG. 10A is a front view of the thermal blocking plate member (26) viewed in the direction of transporting the object to be treated.

The thermal blocking plate member (26) is interposed together with sealing members (17) between a joint member (30) of the heating muffle and a connecting member (22) of the thermal insulating structural member and is fastened by means of bolts/nuts (18). As shown in 10A, the thermal blocking plate member (26) has a rectangular shape and has an aperture (29) having a size necessary to let the object (25) and the carrier (24) pass therethrough. In the apparatus shown in FIG. 9, four sides of the thermal blocking plate member (26) are sandwiched so as to be supported between the joint member (30) of the heating muffle and the connecting member (22) of the thermal insulating structural member.

In FIG. 9, the thermal blocking plate member (26) covers the end of the heating muffle except for the aperture required to pass the object to be treated. The thermal blocking plate member (26) effectively prevents the atmosphere gas from flowing from the thermal treatment zone (14a) of the heating muffle (10) into the thermal treatment zone (14b) of the cooling muffle (13) and prevents radiation heat (indicated by the arrows that are white inside in the drawing) from being transferred from the inside surface of the heating muffle (10) into the cooling muffle (13).

Figure 10B:
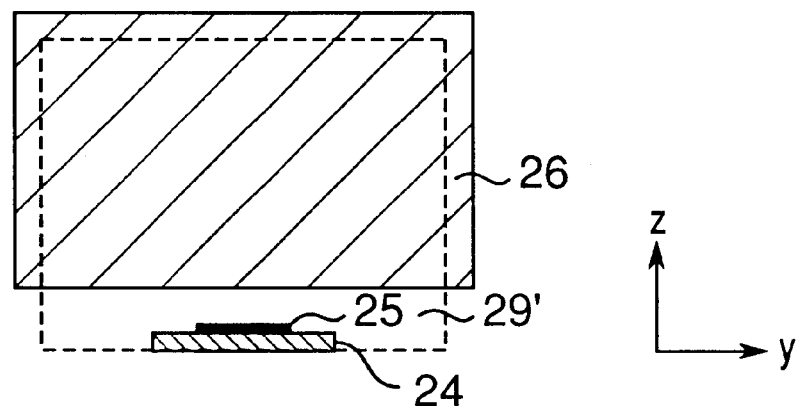
Figure 10C:
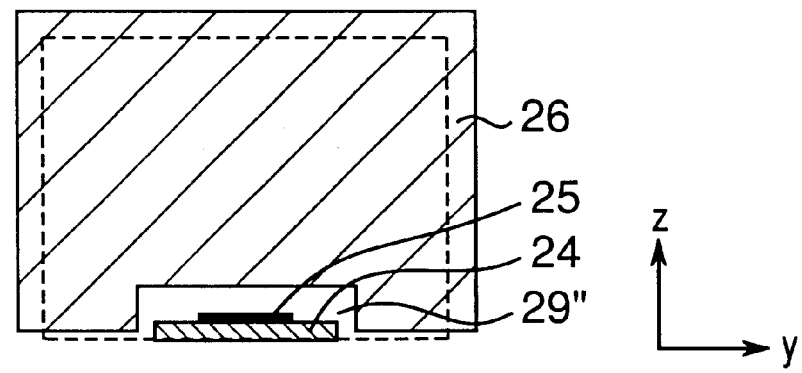
Figure 12:
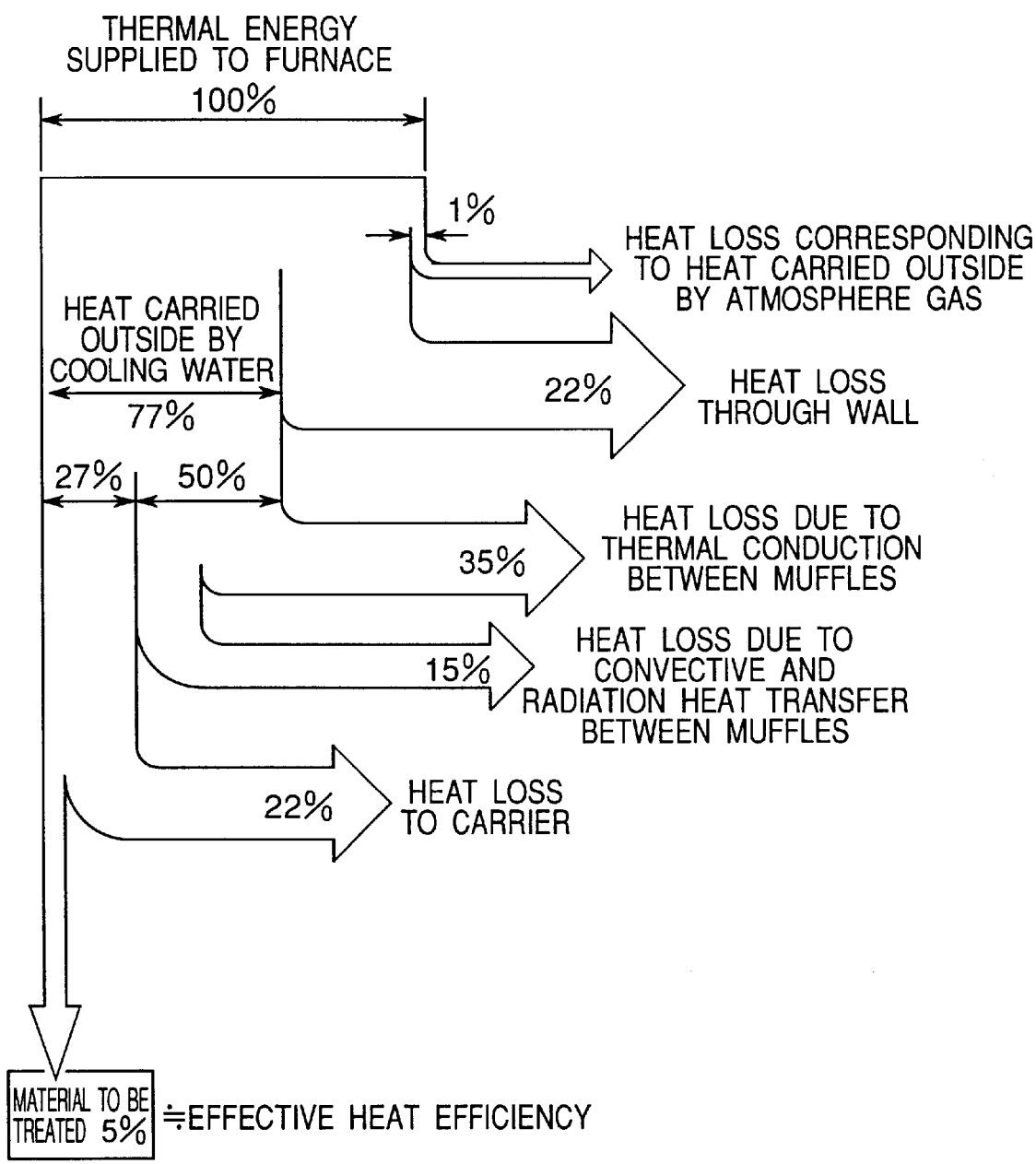
FIG. 12 shows an example of heat balance of a muffle structure heating furnace of the prior art.
Figure 13:
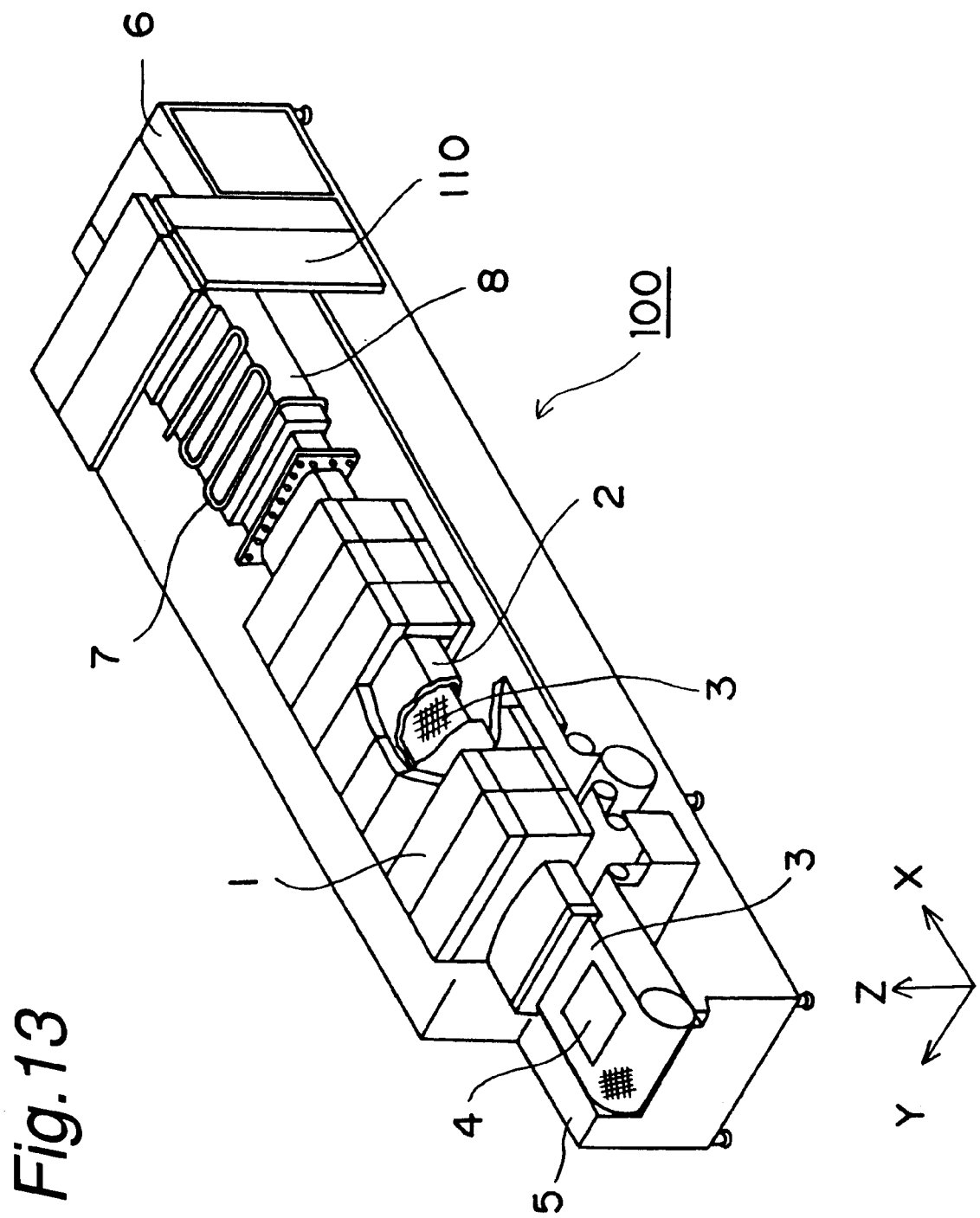
FIG. 13 is a perspective view of the muffle structure heating furnace of the prior art.

Other embodiments of the thermal blocking plate member are shown in FIG. 10B and FIG. 10C.

The thermal blocking plate member (26) shown in FIG. 10B is a rectangular plate member. The thermal blocking plate member is smaller in the z direction length than the z direction length of the cross section (indicated by a dashed line in the drawing) of the thermal treatment zone, so that a clearance (29') can be formed to allow the object (25) to be treated and the carrier (24) to pass therethrough.

The thermal blocking plate member shown in FIG. 10C is a rectangular plate member having a notch (29') of a size required for the object to be treated (25) and the carrier (24) to pass therethrough. The thermal blocking plate member is also smaller in the z direction length than the z direction length of the cross section (indicated by a dashed line in the drawing) of the thermal treatment zone (or the hollow of the thermal insulating structural member).

The thermal blocking plate members shown in FIG. 10B and FIG. 10C are attached to the inside surface of the heating muffle wall so that the end of the heating zone which makes contact with the thermal insulating structural member is covered. The thermal blocking plate members shown in FIG. 10B and FIG. 10C may also be interposed to be supported between the muffle and the thermal insulating structural member, as shown in FIG. 9. In this case, a gap which corresponds to the thickness of the thermal blocking plate member may be formed in the joint between the muffle and the thermal insulating structural member where the thermal blocking plate member is not interposed. In that case, it is necessary to prevent the atmosphere gas from leaking, by interposing, for example, a plate member of the same thickness as that of the thermal blocking plate member in the joint where the gap is generated. Alternatively, formation of the gap may be prevented by making the size of a part of the thermal insulating structural member different from the size of the other part.

The thermal blocking plate members shown in FIGS. 10A to 10C are mere examples, and the thermal blocking plate member may have other shapes.

The thermal blocking plate member may be made of any material as long as the thermal treatment process and the mechanical strength of the thermal treatment apparatus as a whole are not adversely affected. The thermal blocking plate member is preferably a metal plate such as a stainless steel plate, or a meshed member for filtering which does not substantially allow gas to pass therethrough when there is no pressure difference. Moreover, the thermal blocking plate member preferably has a low surface thermal emissivity in order to decrease the heat radiated thereby. Method for lowering the surface thermal emissivity is, for example, polishing the surface of the thermal blocking plate member.

The thermal treatment apparatus according to the first aspect of the present invention has been described exemplifying the joint between the heating muffle and the cooling muffle. The thermal treatment apparatus of the present invention has the thermal insulating structural member disposed between one pair of two adjacent muffles wherein the inside temperature of one muffle is higher than that of the other, namely between a higher temperature muffle and a lower temperature muffle. The combination of the heating muffle and the cooling muffle described above is an example of the combination of the higher temperature muffle and the lower temperature muffle. Another combination of the higher temperature muffle and the lower temperature muffle is, for example, a combination of two heating muffles wherein the inside temperature of one muffle is higher than that of the other muffle by 50° C. A thermal treatment apparatus including such two heating muffles between which the thermal insulating structural member is disposed also falls within the scope of the present invention. A thermal treatment apparatus may also include a plurality of thermal insulating structural members.

The present invention can be applied not only to the muffle furnace, but also to other thermal treatment apparatus having a plurality of thermal treatment chambers. The present invention can also be applied to a heating furnace of batch operation system or the like. In any embodiment of the thermal treatment apparatus, material, shape, size and other properties of the thermal insulating structural member (for example, a thermal conductivity of the material of the wall of the thermal insulating structural member, a thickness of a thin plate in a case where a part of the wall of the thermal insulating structural member is formed of the thin plate, etc.) may be selected depending on the material, thickness and other properties of the wall of the thermal treatment chamber. The thermal blocking plate member shown in FIGS. 10A to 10C may also be provided in the thermal treatment apparatus other than the muffle furnace.

In the thermal treatment apparatus of the present invention, the apparatus for transporting the object to be treated is not limited to the mesh belt as shown in the drawings, and may be other apparatus for transporting the object, such as a roller hearth. The object is transported by the apparatus for transporting continuously or intermittently through the thermal treatment chambers. The thermal treatment apparatus of the present invention may also have other member(s) or component(s) that has not been described above and is used in the conventional thermal treatment apparatus (for example, an air-charging and discharging apparatus).

INDUSTRIAL APPLICABILITY

The present invention can be applied preferably to a thermal treatment apparatus which has a plurality of thermal treatment chambers regardless of the transporting method, the heating method employed in the apparatus and/or its application. The thermal treatment apparatus of the present invention can be used to carry out a thermal treatment for manufacturing different products such as a plasma display panel, a solar battery panel, a resistor chip and other devices and electronic parts.

EXAMPLES

The present invention is described below by way of examples. In the following description, "upper" and "lower" refer to upper position and lower position respectively in the vertical direction, in a case where the-object to be treated is transported in the direction and on the plane which are parallel to the horizontal plane. The term "length" shall mean the length in the direction which is parallel to the direction of transporting the object to be treated. The term "width" shall mean the size in the direction which is parallel to the plane of transporting the object to be treated and is perpendicular to the direction of transporting the object.

Example 1

A thermal treatment apparatus having one heating muffle and one cooling muffle was constructed. In the thermal treatment apparatus, a thermal insulating structural member formed of a wall made of a material of low thermal conductivity was disposed between the heating muffle and the cooling muffle as shown in FIG. 2.

Materials and sizes of the heating muffle (10), the cooling muffle (13), the mesh belt (24), the object (25) to be treated and the thermal insulating structural member (19) in this Example are as follows.

1) Heating muffle
   Material was Inconel 600 of which thermal conductivity at normal temperature was 14.8 W/m·K;
   Wall thickness was 10 mm;
   Configuration of muffle was a tubular shape having a semicircular cross section in which an upper wall is arched, with a flange welded to the end face as a joint member;
   Width, maximum height and length of muffle were 1000 mm, 250 mm and 7000 mm, respectively; and
   Cross section of the thermal treatment zone was a semicircular shape with a width of 980 mm and a maximum height of 225 mm.
2) Cooling muffle
   Material was SUS 304 of which thermal conductivity at normal temperature was 16.5 W/m·K;
   Wall thickness was 7 mm;
   Configuration of muffle was tubular shape having a rectangular cross section, with a flange welded to the end face as a joint member;
   Width, height and length of muffle were 1000 mm, 60 mm and 2000 mm, respectively; and
   Cross section of the thermal treatment zone was a rectangular shape with a width of 986 mm and a height of 46 mm.
3) Mesh belt
   Material was SUS 316; and
   Width and thickness were 940 mm and 10 mm.
4) Object to be treated
   It was a glass substrate for PDP; and
   Width, thickness and length were 600 mm, 5 mm and 900 mm, respectively.
5) Thermal insulating structural member
   Material was a silica-based heat resistant material of which thermal conductivity at normal temperature was 0.05 W/m·K (manufactured by Nippon Microtherm Co., Ltd. under the trade name of Microtherm);
   Configuration was a rectangular tubular shape having a hollow of rectangular cross section;
   Width, thickness and length were 1086 mm, 350 mm and 100 mm, respectively;
   Thickness of an upper wall, a lower wall and a side wall were 70 mm, 50 mm and 20 mm, respectively; and
   Cross section of hollow was a rectangular shape with a width of 986 mm and a height of 46 mm.

As shown in FIG. 2, the sealing members (17) made of carbon were interposed between each wall constituting each muffle and the wall constituting the thermal insulating structural member, and the flanges (16) of the muffles and the thermal insulating structural member (19) were fastened by means of bolts/nuts (18) between the heating muffle and the thermal insulating structural member and between the cooling muffle and the thermal insulating structural member.

Example 2

A thermal treatment apparatus was constructed by providing the thermal insulating structural member formed of a thin plate between the heating muffle and the cooling muffle as shown in FIG. 6. The heating muffle and the cooling muffle of the thermal treatment apparatus of Example 2 are the same as those of Example 1.

In this Example, a stainless steel sheet of 1.0 mm thick was employed as the thin plate. With this thin plate, the thermal insulating structural member (21) was formed into a construction having a hollow of rectangular cross section and a length of 100 mm. A connecting member (22) made of stainless steel plate was used to connect the thermal insulating structural member and the muffle. The thin plate constituting the thermal insulating structural member (21) was fixed to the connecting member (22) by welding.

Example 3

Such a thermal treatment apparatus was constructed as the thermal blocking plate member (26) was disposed between the joint member (30) of the heating muffle and the connecting member, (22) of the thermal insulating structural member as shown in FIG. 9 in the thermal treatment apparatus of Example 2. The heating muffle, the cooling muffle and the thermal insulating structural member of the thermal treatment apparatus of Example 3 are the same as those of Example 2. A stainless steel sheet having thickness of 1.0 mm and surface thermal emissivity of 0.01 was used as the thermal blocking plate member (26). In the thermal blocking plate member, an aperture (29) having a height of 25 mm and a width of 980 mm was formed so as to allow the mesh belt (24) and the object to be treated (25) to pass therethrough as shown in FIG. 10A.

Comparative Example

For comparison, such a thermal treatment apparatus was constructed as neither the thermal insulating structural member nor the thermal blocking plate member was used while the heating muffle (10) and the cooling muffle (13) were connected via the sealing member (17) similar to the thermal treatment apparatus of the prior art shown in FIG. 14.

In each thermal treatment apparatus of Examples 1 to 3 and Comparative Example, the total consumption of electric power in the heating furnace was measured under the condition in which all heater blocks that heat the heating zone were set to 850° C., the flow rate of cooling water that cools the cooling zone was set to 5 m$^3$/min, and the moving speed of the mesh belt was set to 100 mm/min. Electric power supplied to each muffle structure heating furnace is shown in FIG. 11 for comparison.

In the case where the muffles were connected to each other as in the prior art (Comparative Example), power consumption of the entire furnace was 40 kW. Compared to the power consumption of 40 kW as a basis (i.e., 100%) in the case of the thermal treatment apparatus of the Comparative Example, power consumption in each thermal treatment apparatus of Examples 1 to 3 which correspond to the present invention was smaller by 15 to 25%. The largest reduction (25%) in the power consumption by the heater was achieved by a combination of the thermal blocking plate member and the thermal insulating structural member as in Example 3. This shows that the combination of the thermal blocking plate member and the thermal insulating structural member is most effective in reducing the power consumption.

What is claimed is:

1. A thermal treatment apparatus comprising:
   a plurality of thermal treatment chambers operable to apply a thermal treatment to an object to be treated that is transported through said thermal treatment chambers; and a thermal insulating structural member, wherein at least one adjacent pair of said thermal treatment chambers of which inside temperatures are different from each other are connected through said thermal insulating structural member which separates said at least one adjacent pair of said thermal treatment chambers from each other, and said thermal insulating structural member defines a tunnel structure so as to allow the object to be treated to pass therethrough.

2. The thermal treatment apparatus according to claim 1, wherein said at least one adjacent pair of said thermal treatment chambers are muffles.

3. The thermal treatment apparatus according to claim 2, wherein said thermal insulating structural member comprises a wall made of a material that has a lower thermal conductivity than that of a material which constitutes said thermal treatment chambers.

4. The thermal treatment apparatus according to claim 2, wherein said thermal insulating structural member comprises a wall having a non-uniform thickness.

5. The thermal treatment apparatus according to claim 4, wherein said wall has a groove.

6. The thermal treatment apparatus according to claim 2, wherein said thermal insulating member comprises a wall, and at least a part of said wall comprises a thin plate.

7. The thermal treatment apparatus according to claim 2, wherein said thermal insulating structural member is operable to change shape.

8. The thermal treatment apparatus according to claim 2, further comprising a thermal blocking plate member disposed at at least one end of said thermal insulating structural member without impeding passage of the object to be treated.

9. The thermal treatment apparatus according to claim 8, wherein said thermal blocking plate member has an opening through which a carrier and the object to be treated are allowed to pass.

10. The thermal treatment apparatus according to claim 2, wherein the inside temperature of a first chamber of said at least one adjacent pair of said thermal treatment chambers of which the inside temperatures are different from each other is higher than that of a second chamber of said at least one adjacent pair of said thermal treatment chambers by 50° C. or more.

11. The thermal treatment apparatus according to claim 1, wherein said thermal insulating structural member comprises a wall made of a material that has a lower thermal conductivity than that of a material which constitutes said thermal treatment chambers.

12. The thermal treatment apparatus according to claim 1, wherein said thermal insulating structural member comprises a wall having a non-uniform thickness.

13. The thermal treatment apparatus according to claim 12, wherein said wall has a groove.

14. The thermal treatment apparatus according to claim 1, wherein said thermal insulating member comprises a wall, and at least a part of said wall comprises a thin plate.

15. The thermal treatment apparatus according to claim 1, wherein said thermal insulating structural member is operable to change shape.

16. The thermal treatment apparatus according to claim 1, further comprising a thermal blocking plate member disposed at at least one end of said thermal insulating structural member without impeding passage of the object to be treated.

17. The thermal treatment apparatus according to claim 16, wherein said thermal blocking plate member has an opening through which a carrier and the object to be treated are allowed to pass.

18. The thermal treatment apparatus according to claim 1, wherein the inside temperature of a first chamber of said at least one adjacent pair of said thermal treatment chambers of which the inside temperatures are different from each other is higher than that of a second chamber of said at least one adjacent pair of said thermal treatment chambers by 50° C. or more.

19. The thermal treatment apparatus according to claim 18, wherein a first chamber of said at least one adjacent pair of said thermal treatment chambers of which the inside temperatures are different from each other is a heating chamber and a second chamber of said at least one adjacent pair of said thermal treatment chambers is a cooling chamber.

20. The thermal treatment apparatus according to claim 19, wherein said heating chamber is a heating muffle, and said cooling chamber is a cooling muffle.

* * * * *